US009263451B2

(12) United States Patent
Matsubayashi et al.

(10) Patent No.: US 9,263,451 B2
(45) Date of Patent: Feb. 16, 2016

(54) STORAGE DEVICE INCLUDING MEMORY CELL USING TRANSISTOR HAVING OXIDE SEMICONDUCTOR AND AMPLIFIER CIRCUIT

(75) Inventors: Daisuke Matsubayashi, Kanagawa (JP); Tatsuya Ohnuki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 743 days.

(21) Appl. No.: 13/280,874

(22) Filed: Oct. 25, 2011

(65) Prior Publication Data

US 2012/0104480 A1 May 3, 2012

(30) Foreign Application Priority Data

Oct. 29, 2010 (JP) ................................. 2010-243833
May 19, 2011 (JP) ................................. 2011-112645

(51) Int. Cl.
| H01L 27/108 | (2006.01) |
| H01L 29/94 | (2006.01) |
| H01L 27/105 | (2006.01) |
| H01L 21/02 | (2006.01) |
| H01L 27/12 | (2006.01) |

(52) U.S. Cl.
CPC ...... *H01L 27/1052* (2013.01); *H01L 21/02565* (2013.01); *H01L 27/1225* (2013.01)

(58) Field of Classification Search
CPC ............ H01L 27/1052; H01L 27/1225; H01L 21/02565
USPC .......................................... 257/296, E27.084
See application file for complete search history.

(56) References Cited

U.S. PATENT DOCUMENTS

| 4,466,081 A | 8/1984 | Masuoka |
| 4,716,548 A | 12/1987 | Mochizuki |
| 4,758,993 A * | 7/1988 | Takemae ...................... 365/222 |
| 4,777,625 A * | 10/1988 | Sakui et al. .................. 365/207 |
| 5,349,366 A | 9/1994 | Yamazaki et al. |
| 5,351,215 A | 9/1994 | Tanabe |

(Continued)

FOREIGN PATENT DOCUMENTS

| EP | 0191435 A2 | 8/1986 |
| EP | 0340809 A2 | 11/1989 |

(Continued)

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

(Continued)

*Primary Examiner* — Stephen W Smoot
*Assistant Examiner* — Vicki B Booker
(74) *Attorney, Agent, or Firm* — Fish & Richardson P.C.

(57) ABSTRACT

A storage device in which stored data can be held even when power is not supplied, and stored data can be read at high speed without turning on a transistor included in a storage element is provided. In the storage device, a memory cell having a transistor including an oxide semiconductor layer as a channel region and a storage capacitor is electrically connected to a capacitor to form a node. The voltage of the node is boosted up in accordance with stored data by capacitive coupling through a storage capacitor and the potential is read with an amplifier circuit to distinguish data.

18 Claims, 18 Drawing Sheets

(56) References Cited

U.S. PATENT DOCUMENTS

| | | |
|---|---|---|
| 5,469,395 A | 11/1995 | Kuwabara |
| 5,638,322 A * | 6/1997 | Lacey ................... 365/185.2 |
| 5,731,856 A | 3/1998 | Kim et al. |
| 5,744,864 A | 4/1998 | Cillessen et al. |
| 5,801,983 A * | 9/1998 | Saeki ....................... 365/149 |
| 6,127,702 A | 10/2000 | Yamazaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,754,095 B2 | 6/2004 | Tanaka et al. |
| 6,950,329 B2 | 9/2005 | Tanaka et al. |
| 6,950,353 B1 * | 9/2005 | Kim et al. ................. 365/200 |
| 6,982,896 B2 | 1/2006 | Kang |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 * | 3/2007 | Wager et al. ................ 257/43 |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,626,847 B2 | 12/2009 | Kondo et al. |
| 7,674,650 B2 | 3/2010 | Akimoto et al. |
| 7,732,819 B2 | 6/2010 | Akimoto et al. |
| 8,073,058 B2 | 12/2011 | Kondo et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0128570 A1 | 7/2003 | Tanaka et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0239539 A1 | 12/2004 | Tanaka et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0166616 A1 | 7/2009 | Uchiyama |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2012/0025284 A1 * | 2/2012 | Kato et al. .................. 257/296 |
| 2014/0175437 A1 | 6/2014 | Uchiyama |

FOREIGN PATENT DOCUMENTS

| | | |
|---|---|---|
| EP | 1557840 A | 7/2005 |
| EP | 1 737 044 A1 | 12/2006 |
| EP | 2 226 847 A2 | 9/2010 |
| JP | 57-105889 A | 7/1982 |
| JP | 60-198861 A | 10/1985 |
| JP | 61-184789 A | 8/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-242672 A | 9/1993 |
| JP | 05-251705 A | 9/1993 |
| JP | 06-176572 A | 6/1994 |
| JP | 06-295589 A | 10/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002368226 A | 12/2002 |
| JP | 2003-086000 A | 3/2003 |
| JP | 2003-086808 A | 3/2003 |
| JP | 2003143013 A | 5/2003 |
| JP | 2004-103957 A | 4/2004 |
| JP | 2004-158170 A | 6/2004 |
| JP | 2004-273614 A | 9/2004 |
| JP | 2004-273732 A | 9/2004 |
| JP | 2005050493 A | 2/2005 |
| JP | 2009-158663 A | 7/2009 |
| KR | 20030036062 A | 5/2003 |

(56) References Cited

FOREIGN PATENT DOCUMENTS

| KR | 2005014170 A | 2/2005 |
|---|---|---|
| WO | 2004/114391 A1 | 12/2004 |
| WO | WO-2009/034953 | 3/2009 |

OTHER PUBLICATIONS

Wonchan Kim et al.; An Experimental High-Density DRAM Cell with a Built-in Gain Stage; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

"International Search Report (Application No. PCT/JP2011/074884) Dated Dec. 6, 2011, in English."

Written Opinion (Application No. PCT/JP2011/074884) Dated Dec. 6, 2011, in English.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center (with English translation).

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates, D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

(56) References Cited

OTHER PUBLICATIONS

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector with Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs with a Novel Passivation Layer," SID Digest '09 : SID International Symposium Digest of Technical Papers, May 31, 2009, pp. 284-287.

* cited by examiner c-axis direction

Charge 0

Charge +1

Charge 0 a-b plane

Charge -1

Charge 0

● In
☾ Sn
☾ Zn
● O

- ● In
- ○ Ga
- ○ Zn
- • O

FIG. 10A $$\mu = \mu_0 \exp(-\frac{E}{kT})$$

FIG. 10B $$E = \frac{e^2 N^2}{8\varepsilon n} = \frac{e^3 N^2 t}{8\varepsilon C_{ox} V_g}$$

FIG. 10C $$I_d = \frac{W \mu V_g V_d C_{ox}}{L} \exp(-\frac{E}{kT})$$

FIG. 10D $$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g}$$

FIG. 10E $$\frac{1}{\mu_1} = \frac{1}{\mu_0} + \frac{D}{B} \exp\left(-\frac{x}{G}\right)$$

STORAGE DEVICE INCLUDING MEMORY CELL USING TRANSISTOR HAVING OXIDE SEMICONDUCTOR AND AMPLIFIER CIRCUIT

TECHNICAL FIELD

The invention disclosed herein relates to a storage device including a semiconductor element.

BACKGROUND ART

Storage devices using semiconductor elements are broadly classified into two categories: a volatile storage device that loses stored data when power supply stops, and a non-volatile storage device that holds stored data even when power supply stops.

A typical example of a volatile storage device is a dynamic random access memory (DRAM). A DRAM stores data in such a manner that a transistor included in a storage element is selected and charge is stored in a capacitor. Thus, when data is read from a DRAM, charge in a capacitor is lost, so that another writing operation is necessary whenever data is read. Moreover, since leakage current (off-state current) or the like flows between a source and a drain of a transistor included in a storage element when the transistor is in an off-state, charge flows into or out even if the transistor is not selected, which makes a data holding period short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to hold the data for a long time.

Another example of a volatile storage device is a static random access memory (SRAM). An SRAM holds stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region of a transistor and stores data by holding charge in the floating gate. Therefore, a flash memory has advantages in that the data holding period is extremely long (almost permanent) and refresh operation which is necessary in a volatile storage device is not needed (e.g., see Patent Document 1).

However, a gate insulating layer included in a storage element deteriorates by tunneling current generated at the time of writing, so that the storage element stops its function after a given number of times of writing operation. In order to reduce adverse effects of the problem of lifetime, a method in which the number of times of writing operation of storage elements is equalized is employed, for example. However, a complicated peripheral circuit is needed to carry out this method. Moreover, even when such a method is employed, the fundamental problem of lifetime cannot be solved. That is, a flash memory is not suitable for applications in which data is frequently rewritten.

Further, high voltage is necessary in order to inject charge into the floating gate or remove the charge, and a circuit therefor is required. Therefore, there is a problem of high power consumption. Furthermore, it takes a relatively long time to inject or remove charge, and it is not easy to perform writing and erasing at higher speed.

REFERENCE

Patent Document

[Patent Document 1] Japanese Published Patent Application No. S57-105889

DISCLOSURE OF INVENTION

In view of the foregoing problems, it is an object of one embodiment of the disclosed invention to provide a storage device with a novel structure in which stored data can be held even when power is not supplied, and does not have a limitation on the number of times of writing operation.

In one embodiment of the disclosed invention, stored data can be read at high speed without turning on a transistor included in a storage element by employing the novel structure. It is another object of one embodiment of the disclosed invention to simplify a storage device to increase the storage capacity per unit area.

In one embodiment of the present invention, a transistor used for a memory cell is formed using a semiconductor material which can decrease off-state current sufficiently, for example, a wide-gap semiconductor material (such as an oxide semiconductor material) as a channel region, and a memory cell including the transistor and a storage capacitor is electrically connected to a capacitor to form a node. The voltage of the node is boosted up in accordance with stored data by capacitive coupling through a storage capacitor and the potential is read with an amplifier circuit to distinguish data. The node is in an electrically floating state.

In one embodiment of the present invention, a transistor used for a memory cell is formed using a semiconductor material which can decrease off-state current sufficiently, for example, a wide-gap semiconductor material (such as an oxide semiconductor material) as a channel region. A plurality of memory cells are connected in parallel to a word line and a storage capacitor in each memory cell is connected to a capacitor to form a node. In addition, data in a plurality of memory cells can collectively be read by reading the potential of the node because each capacitance value of a plurality of storage capacitors is different from each other.

In one embodiment of the present invention, a reference circuit for converting the potential of the node into the state of data in the memory cell has the same circuit configuration as the memory cell.

In one embodiment of the present invention, the number of memory cells in one block is set as appropriate and a number of the blocks are arranged; thus, data can collectively be read with a few elements.

The term such as "electrode" or "wiring" in this specification and the like does not limit a function of a component. For example, an "electrode" is sometimes used as part of a "wiring", and vice versa. Further, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an "object having any electric function". Here, there is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

A storage device according to one embodiment of the present invention can hold charge which is supplied to a storage capacitor for a long time because off-state current of a transistor formed using a wide-gap semiconductor material (specifically, an oxide semiconductor material) is sufficiently small. In other words, power consumption can be reduced because refresh operation becomes unnecessary or the frequency of refresh operation can be extremely low. Further, stored data can be held for a long time even when power is not supplied (note that a potential is preferably fixed). Furthermore, data can be read by measuring the potential of a node instead of by switching on and off a transistor; thus, the storage device can perform high speed operation.

In such a manner, one embodiment of the present invention can provide a storage device with a novel structure in which stored data can be held even when power is not supplied, and does not have a limitation on the number of times of writing operation. In addition, stored data can be read at high speed without turning on a transistor included in a storage element and a storage device can be simplified to increase the storage capacity per unit area.

BRIEF DESCRIPTION OF DRAWINGS

In the accompanying drawings:

FIGS. 10A to 10E are formulas for calculating mobility;

BEST MODE FOR CARRYING OUT THE INVENTION

Figure 1A:
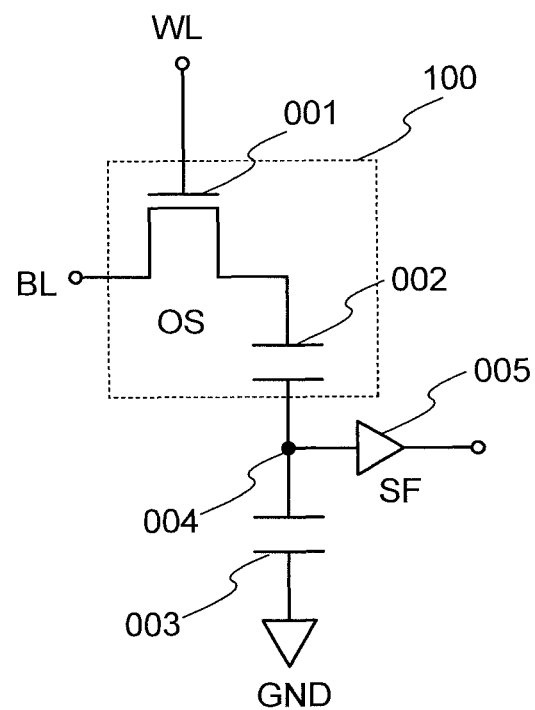
FIGS. 1A and 1B are circuit diagrams of a storage device.

Hereinafter, examples of embodiments of the disclosed invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, the size, the range, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, a circuit configuration and operation of a storage device according to one embodiment of the disclosed invention will be described with reference to FIGS. 1A and 1B. Note that in each of circuit diagrams, in some cases, "OS" is written beside a transistor in order to indicate that the transistor includes an oxide semiconductor.

First, a basic circuit configuration and operation thereof will be described with reference to FIG. 1A. In a storage device illustrated in FIG. 1A, a word line (WL) is electrically connected to a gate electrode of a transistor 001, a bit line (BL) is electrically connected to a source electrode (or a drain electrode) of the transistor 001, and one terminal of a storage capacitor 002 is electrically connected to the drain electrode (or the source electrode) of the transistor 001. In addition, the other terminal of the storage capacitor 002 is electrically connected to one terminal of a capacitor 003 to form a node 004. The node 004 is electrically connected to an amplifier circuit 005.

Here, a transistor including an oxide semiconductor which is a wide-gap semiconductor material is used as the transistor 001, for example. A transistor including an oxide semiconductor has a characteristic of significantly small off-state current. For this reason, when the transistor 001 is placed in an off-state, the potential of the drain electrode of the transistor 001 can be held for an extremely long time. Further, when the storage capacitor 002 is provided, charge supplied to the drain electrode of the transistor 001 can be held easily.

Figure 1B:
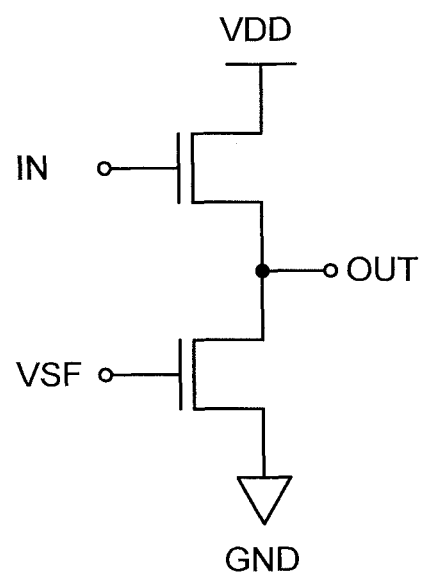

In the circuit configuration illustrated in FIG. 1A, writing and holding of data are performed by the transistor 001 and the storage capacitor 002. This portion is referred to as a memory cell 100. Reading of data is performed by measuring a potential ($V_N$) of a node 004 where the storage capacitor 002 and the capacitor 003 are connected. Note that the node 004 is in an electrically floating state. As the amplifier circuit 005 which measures the potential, for example, a source follower (SF) circuit illustrated in FIG. 1B can be used. The source follower circuit is a circuit in which a first transistor and a second transistor are connected in parallel. A gate of the first transistor is connected to an input terminal (IN), a first electrode of the first transistor is connected to VDD, and a second electrode of the first transistor is connected to a first electrode of the second transistor. In addition, a gate of the second transistor is connected to VSF and a second electrode of the second transistor is connected to GND. An output terminal (OUT) is connected to the connecting portion of the second electrode of the first transistor and the first electrode of the second transistor. The potential output from the output terminal (OUT) is the same as the potential input to an input terminal (IN) of the source follower circuit. Note that other amplifier circuits may be used instead of the source follower circuit.

Writing and holding of data in this embodiment will be described. First, the potential of the word line is set to a potential at which the transistor 001 is turned on, so that the transistor 001 is turned on. Accordingly, a potential V1 of the bit line is supplied to the drain electrode of the transistor 001 and the storage capacitor 002. That is, predetermined charge is supplied to the storage capacitor 002 (writing). After that, the potential of the word line is set to potential at which the transistor 001 is turned off, so that the transistor 001 is turned off. Accordingly, the charge given to the storage capacitor 002 is held (holding).

When the capacitance of the storage capacitor 002 is denoted by C1 and the capacitance of the capacitor 003 is denoted by C0 while the potential V1 is written in the memory cell 100, the potential $V_N$ of the node 004 can be expressed as Formula 1.

$$V_N = \frac{C1 \times V1}{(C1 + C0)} \quad \text{[FORMULA 1]}$$

As shown in Formula 1, the potential $V_N$ of the node 004 is proportional to the writing potential, that is, the potential V1 supplied to the bit line; thus, $V_N$ and the state of data in the memory cell are in a one-to-one correspondence. Therefore, stored data can be distinguished (reading) by measuring $V_N$. For example, in the case of a binary potential: V1=V or V1=0 (V>0), is considered, a threshold value for determining data by $V_N$ is set at an intermediate value between C1×V/(C1+C0) and 0 whereby $V_N$ can be distinguished; that is, the state of data in the memory cell is "1" (V1=V) when $V_N$=C1×V/(C1+C0) while the state of data in the memory cell is "0" (V1=0) when $V_N$=0. This can be easily applied in the case where V1 has two or more values.

According to this embodiment, the state of data in the memory cell 100 can be distinguished without turning the transistor 001 on. Thus, the property of the transistor 001, which is extremely low off-state current, can be utilized to maximum and semi-permanent data storage (i.e., non-volatility) can be obtained. In addition, it is not necessary to drive the transistor 001 for reading of data; therefore, data can be read at an extremely high speed.

Next, rewriting of data will be described. Rewriting of data is performed in a manner similar to that of the writing and holding of data. In other words, the potential of the word line is set to a potential at which the transistor 001 is turned on, so that the transistor 001 is turned on. Accordingly, a potential of the bit line (a potential for new data) is supplied to the drain electrode of the transistor 001 and the storage capacitor 002. After that, the potential of the word line is set to the potential at which the transistor 001 is turned off, so that the transistor 001 is turned off. Accordingly, the charge related to new data is kept in the storage capacitor 002.

In a storage device according to one embodiment of the disclosed invention, data can be directly rewritten by another writing of data as described above. Therefore, extraction of charge from a floating gate with the use of high voltage which is necessary for a flash memory or the like is not needed, and thus the problem of deterioration of a gate insulating layer (also referred to as a tunnel insulating film), which is pointed out in a conventional floating gate transistor, does not exist. That is, the deterioration of a gate insulating layer due to injection of electrons into a floating gate, which has been regarded as a problem, can be solved. This means that there is no limitation on the number of times of writing in principle. Further, high voltage needed for writing or erasing in a conventional floating gate transistor is not necessary.

Since sufficiently high speed operation can be performed by a transistor including a material other than an oxide semiconductor, a semiconductor device can perform operation (e.g., reading operation of data) at sufficiently high speed using the transistor in combination with a transistor including an oxide semiconductor. Further, a transistor including a material other than an oxide semiconductor can favorably fabricate a variety of circuits (such as a logic circuit or a driver circuit) which are required to operate at high speed.

Embodiment 2

Figure 2:
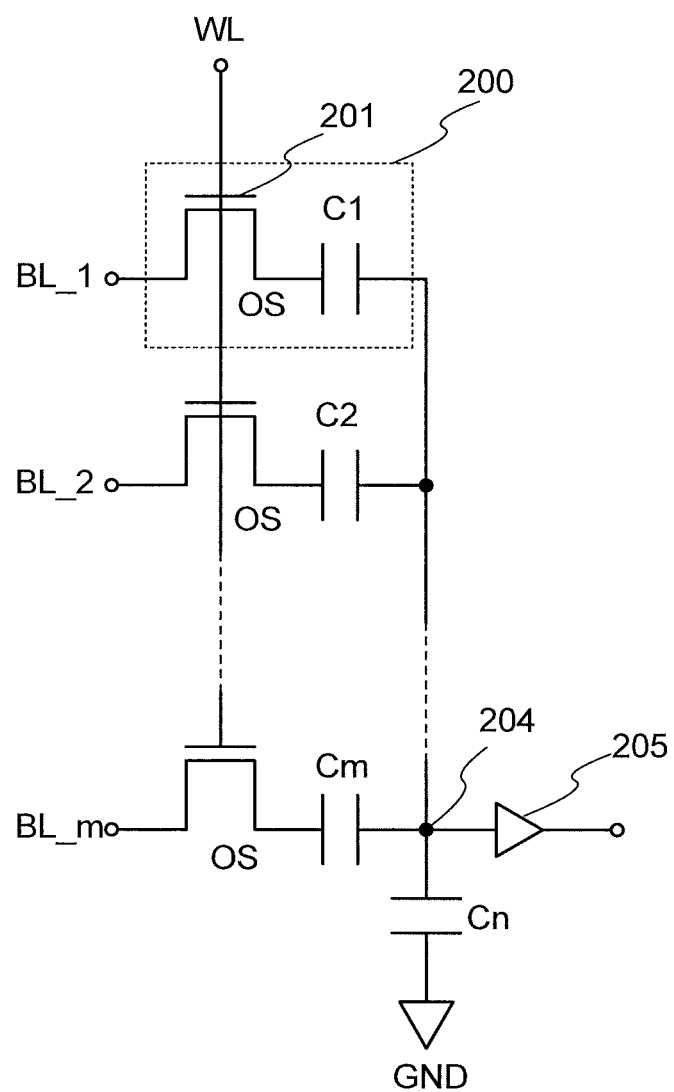
FIG. 2 is a circuit diagram of a storage device.

In this embodiment, writing and reading operation and a circuit configuration of a storage device according to one embodiment of the disclosed invention in which m memory cells 200 (m is a natural number) are provided in parallel will be described. As illustrated in FIG. 2, each of m memory cells 200 has a transistor 201 including an oxide semiconductor, which performs writing and holding of data, and a storage capacitor Ci (i=1, 2, . . . , or in). A node 204 is a portion where the storage capacitor Ci (i=1, 2, . . . , or in) is connected to a capacitor Cn and shared by m memory cells. In addition, the node 204 is electrically connected to an amplifier circuit 205.

Reading of data stored in the in memory cells in this embodiment can be performed by measuring the potential $V_N$ of the node. For example, in the case where a corresponding potential Vi (i=1, 2, . . . , or in) is written in each of m memory cells, $V_N$ can be calculated by Formula 2.

$$V_N = \frac{\sum C_i \times V_i}{C_{total} + C_n} \quad \text{[FORMULA 2]}$$

Note that Ctotal=(C1+C2+ . . . +Cm) is satisfied. When a one-to-one correspondence between values of $V_N$ obtained in this manner and the states of data in m memory cells is established, the states of data in m memory cells can be read at one time by measuring $V_N$. The one-to-one correspondence can be established in the following manner.

Here, the case of a binary potential: Vi=V or Vi=0 (V>0), will be described for simplification. A state where a potential V is written in a memory cell is referred to as a "1" state and a state where the potential of 0 is written in a memory cell is referred to as a "0" state. All combinations of written states of m memory cells are as follows: (0 . . . 000), (0 . . . 001), (0 . . . 010), (0 . . . 011), . . . , and (1 . . . 111). In such a case, the capacitance of the storage capacitor Ci (i=1, 2, . . . , or m) may be set so that the potential $V_N$ of the node at the time satisfies an inequality shown in Formula 3.

$$V_N(0\ldots000) < V_N(0\ldots001) < V_N(0\ldots010) < V_N(0\ldots011) < \ldots < V_N(1\ldots111) \quad \text{[FORMULA 3]}$$

Specifically, in the case where m is 3 will be described below. The combinations of written states of three memory cells can be expressed as follows: (000), (001), (010), (011), (100), (101), (110), and (111). Each potential $V_N$ of the node is proportional to a capacitance value: $V_N(000)$ is 0, $V_N(001)$ is proportional to C1, $V_N(010)$ is proportional to C2, $V_N(011)$ is proportional to C2+C1, $V_N(100)$ is proportional to C3, $V_N(101)$ is proportional to C3+C1, $V_N(110)$ is proportional to C3+C2, and $V_N(111)$ is proportional to C3+C2+C1. Note that a proportionality coefficient is 1/(Ctotal+Cn) and it is common. The capacitance values C1, C2, and C3 of the storage capacitor are set so that each potential $V_N$ satisfies the inequality shown in Formula 3, and thus each state of data in three memory cells and each potential $V_N$ can be in a one-to-one correspondence. For example, the ratio of the capacitances may be set to a power of two such as $C1=2^0 \cdot C^*$, $C2=2^1 \cdot C^*$, or $C3=2^2 \cdot C^*$. Note that $C^*$ is a proportionality coefficient.

As described above, in a plurality of memory cells in one embodiment of the present invention, each storage capacitor has a different capacitance value, so that data in a plurality of memory cells can collectively be read. In addition, the number of memory cells in one block is set as appropriate and a number of the blocks are arranged; thus, data can collectively be read with a few elements. Thus, a circuit configuration can be simplified to increase the storage capacity per unit area. Furthermore, this can be easily applied in the case where Vi has two or more values.

Figure 5:
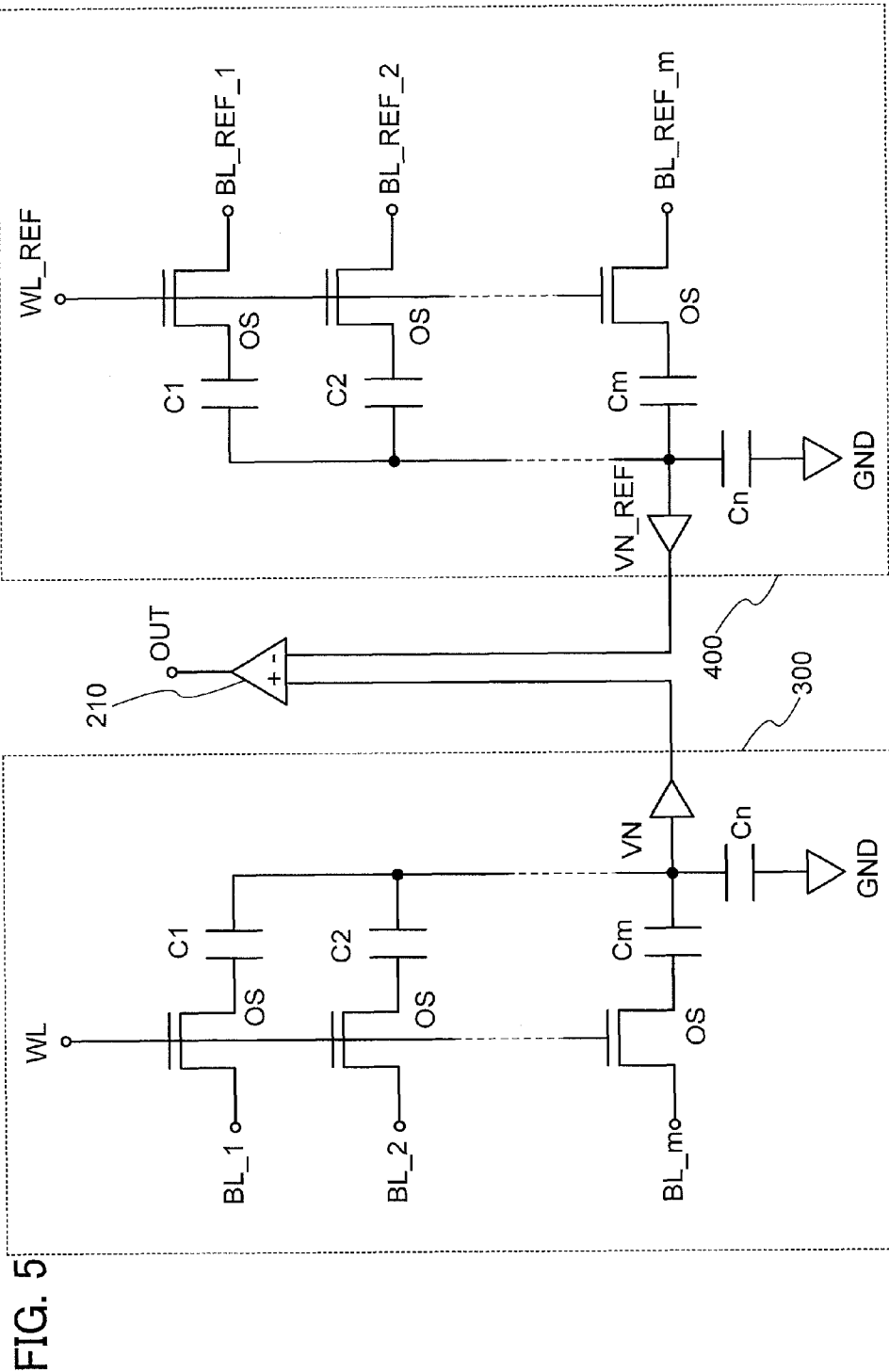
FIG. 5 is a circuit diagram of a storage device.

Next, a method for converting a measured value of $V_N$ into a state of data in m memory cells will be described. In some cases, a correspondence table between all values that $V_N$ can have and states of data is prepared and stored in advance. Note that in such cases, $2^{x \times m}$ correspondence relations should be latched when Vi has $2^x$ values. Alternatively, a circuit similar to that illustrated in FIG. 2 is provided as a reference circuit in a storage device so that the reference circuit can be used to convert $V_N$ into states of data (see FIG. 5). In a circuit illustrated in FIG. 5, a storage device 300 and a reference circuit 400 are connected with a differential amplifier circuit 210 provided therebetween. The values of $V_N$ and an output $V_N\_REF$ from the reference circuit are compared with each other with the use of the differential amplifier circuit 210 and the state of data in the reference circuit is renewed by a bisection method in each comparison. As a result, the state of data stored in the reference circuit corresponds to the desired state of data in m memory cells after x×m times of comparison. In other words, the reference circuit also serves as a sense latch. Then, appropriate voltage is applied to a word line (WL_REF) of the reference circuit in order to turn all the transistors on whereby data can be output to the outside. As described above, according to one embodiment of the present invention, a correspondence table between all values that the potential of the node can have and states of data is not needed to be prepared nor stored in advance. Further, a circuit therefor is also unnecessary.

Embodiment 3

Figure 6:
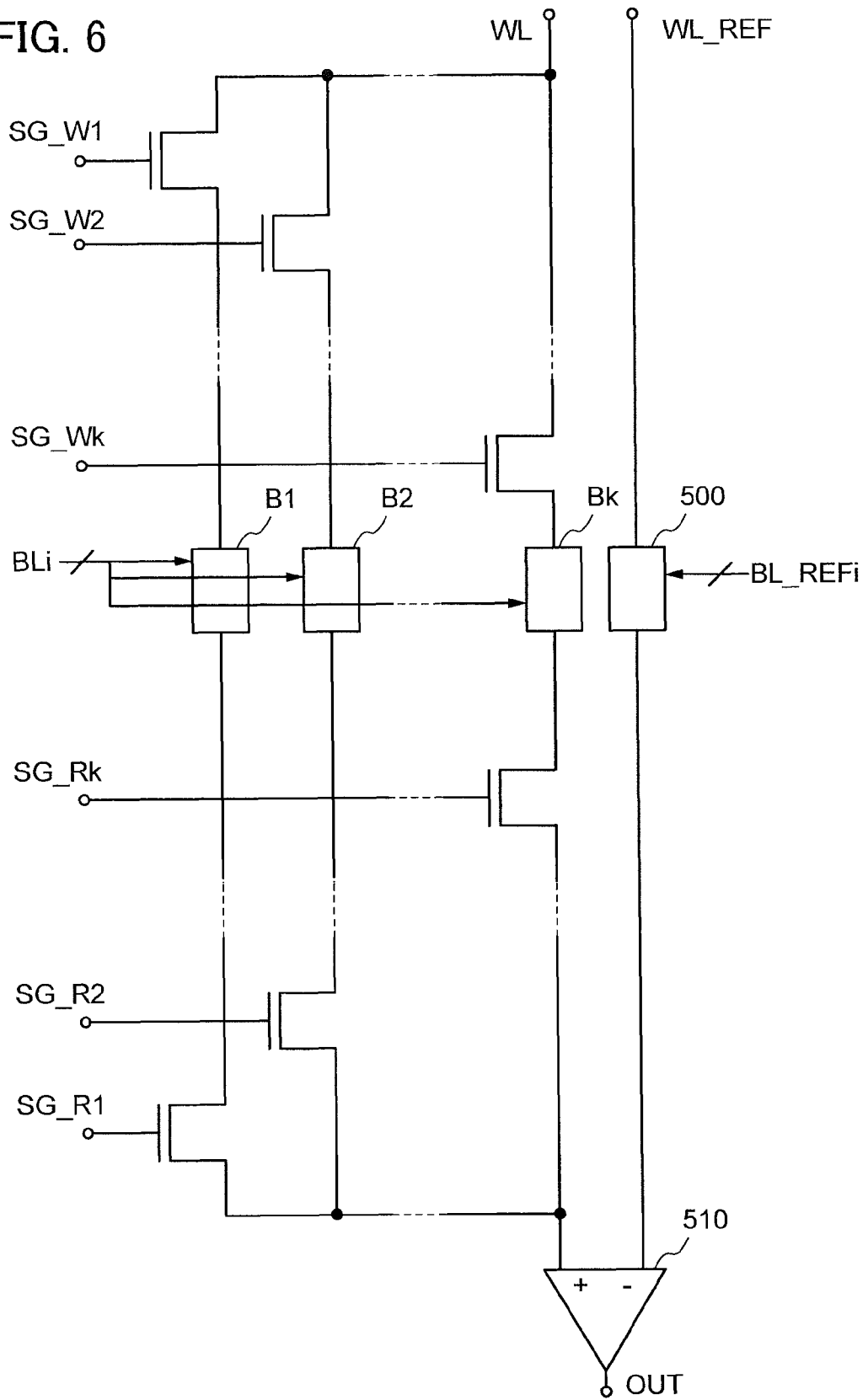
FIG. 6 is a circuit diagram of a storage device.

In this embodiment, operation and a circuit configuration of a storage device according to one embodiment of the disclosed invention in which the circuit illustrated in FIG. 2 is used as one block will be described (see FIG. 6). The circuit illustrated in FIG. 6 includes a word line WL, a word line WL_REF, a writing selection gate SG_Wj (j=1, 2, . . . , or k, k is a natural number), a reading selection gate SG_Rj (j=1, 2, . . . , or k, k is a natural number), a bit line BLi (i=1, 2, . . . , or m, m is a natural number), a bit line BL_REFi (i=1, 2, . . . , or m, m is a natural number), a differential amplifier circuit 510, a block Bj (j=1, 2, . . . , or k, k is a natural number) including m memory cells, a writing selection transistor and a reading selection transistor each connected to the block, and a reference circuit 500. The blocks Bj are connected in parallel to the word line and the blocks Bj are connected to the reference circuit 500 with the differential amplifier circuit 510 provided therebetween. When m, the number of memory cells included in one block, is increased, it is necessary to form capacitors with a variety of capacitance, and thus the manufacturing process becomes complicated. Accordingly, a configuration in which the number of memory cells in one block is set to be an appropriate number (for example, m=8) and a number of the blocks Bj are arranged. Writing and reading are performed in each selected block Bj. With the above configuration, the number of memory cells connected to the word line at the time of writing can be reduced even when the number of memory cells is increased. Thus, the parasitic capacitance and the parasitic resistance of the word line can be reduced to prevent delay of the pulses of signals input to the word line or an increase in the potential drop of the word line; accordingly, the incidence of error in the storage device can be reduced. In addition, only one reference circuit is needed for converting the potential $V_N$ into the state of data.

Embodiment 4

Next, an example of a method for manufacturing the memory cell 100 illustrated in FIGS. 1A and 1B will be described with reference to FIGS. 3A to 3D.

Figure 3A:
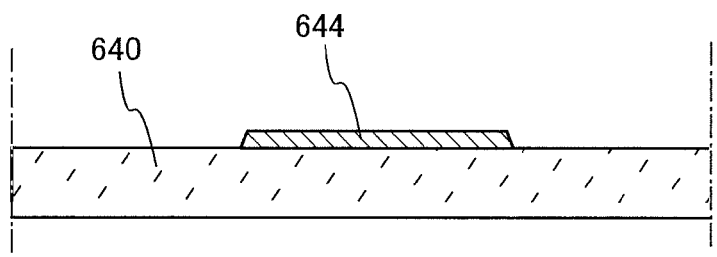
FIGS. 3A to 3D are cross-sectional views illustrating a manufacturing process of a storage device.

First, an oxide semiconductor film is formed over an insulating film 640, and the oxide semiconductor film is processed into an oxide semiconductor film 644 (see FIG. 3A).

The insulating film 640 is formed using a material including an inorganic insulating material such as silicon oxide, silicon oxynitride, silicon nitride oxide, silicon nitride, or aluminum oxide. The insulating film 640 can be formed to have a single-layer structure or a stacked-layer structure using any of the above materials. Here, the case in which silicon oxide is used for the insulating film 640 will be described.

Note that an oxide semiconductor preferably contains at least indium (In) or zinc (Zn). In particular, both In and Zn are preferably contained.

As a stabilizer for reducing variation in electric characteristics of a transistor including the oxide semiconductor, it is preferable that one or more selected from gallium (Ga), tin (Sn), hafnium (Hf), aluminum (Al), or lanthanoid be contained.

As lanthanoid, lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As a single-component metal oxide included in the oxide semiconductor, for example, an indium oxide, a tin oxide, a zinc oxide, or the like can be used.

As a two-component metal oxide included in the oxide semiconductor, for example, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, or the like can be used.

As a three-component metal oxide included in the oxide semiconductor, for example, an In—Ga—Zn-based oxide (also referred to as IGZO), an In—Sn—Zn-based oxide (also referred to as ITZO), a Sn—Ga—Zn-based oxide, an In—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an Al—Ga—Zn-based oxide, a Sn—Al—Zn-based oxide, or the like can be used.

As a four-component metal oxide included in the oxide semiconductor, for example, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like can be used.

Note that here, for example, an "In—Ga—Zn-based oxide" means an oxide containing In, Ga, and Zn as its main components and there is no particular limitation on the ratio of In, Ga, and Zn. The In—Ga—Zn-based oxide may contain another metal element in addition to In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used.

Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used depending on needed semiconductor characteristics (e.g., mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

The oxide semiconductor may be either single crystal or non-single-crystal.

In the case where the oxide semiconductor is non-single-crystal, the oxide semiconductor may be either amorphous or polycrystalline. Further, the oxide semiconductor may have a structure including a crystalline portion in an amorphous portion. Note that it is preferable to use non-amorphous because amorphous includes many defects.

It is preferable to form the oxide semiconductor film by a method in which impurities such as hydrogen, water, a hydroxyl group, or hydride do not easily enter the oxide semiconductor film. The oxide semiconductor film can be formed by a sputtering method or the like, for example.

Here, the oxide semiconductor film is formed by a sputtering method using an In—Ga—Zn-based oxide target.

As the In—Ga—Zn-based oxide target, for example, an oxide target having a composition ratio of $In_2O_3$:$Ga_2O_3$:ZnO=1:1:1 [molar ratio] can be used. Note that the material and the composition of the target are not necessarily limited to the above. For example, an oxide target having a composition ratio of $In_2O_3$:$Ga_2O_3$:ZnO=1:1:2 [molar ratio] can also be used.

The filling rate of the oxide target is higher than or equal to 90% and lower than or equal to 100%, preferably, higher than or equal to 95% and lower than or equal to 99.9%. With the use of the metal oxide target with a high filling rate, a dense oxide semiconductor film can be formed.

The deposition atmosphere may be a rare gas (typically argon) atmosphere, an oxygen atmosphere, a mixed atmosphere containing a rare gas and oxygen, or the like. Further, it is preferable to employ an atmosphere using a high-purity gas in which impurities such as hydrogen, water, a hydroxyl group, or hydride are sufficiently removed because entry of hydrogen, water, a hydroxyl group, and hydride into the oxide semiconductor film can be prevented.

For example, the oxide semiconductor film can be formed as follows.

First, the substrate is held in a deposition chamber which is kept under reduced pressure, and then is heated so that the substrate temperature reaches a temperature higher than or equal to 200° C. and lower than or equal to 500° C., preferably higher than or equal to 300° C. and lower than or equal to 500° C.

Then, a high-purity gas from which impurities such as hydrogen, water, a hydroxyl group, or hydride are sufficiently removed is introduced while moisture remaining in the deposition chamber is removed, and the oxide semiconductor film is fainted over the substrate with the use of the above target. In order to remove moisture remaining in the deposition chamber, an entrapment vacuum pump such as a cryopump, an ion pump, or a titanium sublimation pump is preferably used as an evacuation unit. Further, an evacuation unit may be a turbo pump provided with a cold trap. In the deposition chamber which is evacuated with the cryopump, for example, impurities such as hydrogen, water, a hydroxyl group, or hydride (preferably, also a compound including a carbon atom) or the like are removed, whereby the concentration of impurities such as hydrogen, water, a hydroxyl group, or hydride in the oxide semiconductor film formed in the deposition chamber can be reduced.

In the case where the substrate temperature is low (for example, 100° C. or lower) during deposition, a substance including a hydrogen atom may enter the oxide semiconductor; thus, it is preferable that the substrate be heated to a temperature in the above range. When the oxide semiconductor film is formed over the substrate that is heated to the temperature in the above range, the substrate temperature is high; thus, hydrogen bonds are cut due to heat and the substance including a hydrogen atom is less likely to be taken into the oxide semiconductor film. Therefore, when the oxide semiconductor film is formed over the substrate that is heated to the temperature in the above range, the concentration of impurities such as hydrogen, water, a hydroxyl group, or a hydride in the oxide semiconductor film can be sufficiently reduced. Further, damage due to sputtering can be reduced.

As an example of the deposition conditions, the following conditions can be employed: the distance between the substrate and the target is 60 mm; the pressure is 0.4 Pa; the direct-current (DC) power source is 0.5 kW; the substrate temperature is 400° C.; and the deposition atmosphere is an oxygen atmosphere (the proportion of the oxygen flow rate is 100%). Note that a pulse direct current power source is preferable because powder substances (also referred to as particles or dust) generated in deposition can be reduced and the film thickness can be uniform.

Note that before the oxide semiconductor film is formed by a sputtering method, powdery substances (also referred to as particles or dust) attached on a formation surface of the oxide semiconductor film are preferably removed by reverse sputtering in which an argon gas is introduced and plasma is generated. The reverse sputtering refers to a method in which voltage is applied to a substrate side to generate plasma in the vicinity of the substrate to modify a surface. Note that instead of argon, a gas such as nitrogen, helium, oxygen, or the like may be used.

Next, the oxide semiconductor film is processed, whereby the oxide semiconductor film 644 is formed. The oxide semiconductor film can be processed by being etched after a mask having a desired shape is formed over the oxide semiconductor film. The mask may be formed by a method such as photolithography. Alternatively, a method such as an ink-jet method may be used to form the mask. For the etching of the oxide semiconductor film, either wet etching or dry etching may be employed. It is needless to say that both of them may be employed in combination.

After that, the oxide semiconductor film 644 may be subjected to heat treatment (first heat treatment). The heat treatment further removes a substance including a hydrogen atom in the oxide semiconductor film 644; thus, a structure of the oxide semiconductor film 644 can be improved and defect levels in energy gap can be reduced. The heat treatment is performed in an inert gas atmosphere at higher than or equal to 250° C. and lower than or equal to 700° C., preferably higher than or equal to 450° C. and lower than or equal to 600° C., or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is higher than or equal to 6 N (99.9999%), preferably higher than or equal to 7 N (99.99999%) (that is, the concentration of the impurities is lower than or equal to 1 ppm, preferably lower than or equal to 0.1 ppm).

The heat treatment can be performed in such a manner that, for example, an object to be heated is introduced into an electric furnace in which a resistance heating element or the like is used and heated, in a nitrogen atmosphere at 450° C. for one hour. During the heat treatment, the oxide semiconductor film 644 is not exposed to the air to prevent the entry of water and hydrogen.

The impurities are reduced by the heat treatment, leading to an i-type oxide semiconductor film (an intrinsic oxide semiconductor film) or a substantially i-type oxide semiconductor film. Accordingly, a transistor having extremely excellent characteristics can be fabricated.

Note that the above heat treatment has an advantageous effect of removing hydrogen, water, and the like and can be referred to as dehydration treatment, dehydrogenation treatment, or the like. The heat treatment can be performed at the timing, for example, before the oxide semiconductor film is processed into an island shape or after a gate insulating layer is formed. Such dehydration treatment or dehydrogenation treatment may be performed once or plural times.

Note that it has been pointed out that an oxide semiconductor is insensitive to impurities, there is no problem even when a considerable amount of metal impurities is contained in the film, and therefore soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. Alkali metal is not an element included in an oxide semiconductor, and therefore is an impurity. Also, alkaline earth metal is an impurity in the case where alkaline earth metal is not an element included in an oxide semiconductor. Alkali metal, in particular, Na becomes Na$^+$ and Na$^+$ diffuses into an insulating film in the case where the insulating film is an oxide and in contact with the oxide semiconductor film. In addition, in the oxide semiconductor film, Na$^+$ cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the concentration of hydrogen in the oxide semiconductor film is very low. Therefore, when the concentration of hydrogen in the oxide semiconductor film is lower than or equal to $5\times10^{19}$ cm$^{-3}$, particularly lower than or equal to $5\times10^{18}$ cm$^{-3}$, the concentration of the above impurity is preferably reduced. Specifically, a measurement value of a Na concentration by secondary ion mass spectrometry is preferably lower than or equal to $5\times10^{16}$/cm$^3$, more preferably lower than or equal to $1\times10^{16}$/cm$^3$, or still more preferably lower than or equal to $1\times10^{15}$/cm$^3$. In a similar manner, a measurement value of a Li concentration is preferably lower than or equal to $5\times10^{15}$/cm$^3$, more preferably lower than or equal to $1\times10^{15}$/cm$^3$. In a similar manner, a measurement value of a K concentration is preferably lower than or equal to $5\times10^{15}$/cm$^3$, more preferably lower than or equal to $1\times10^{15}$/cm$^3$.

Further, in order to prevent a transistor formed using the oxide semiconductor film 644 from being in a normally-on state (a state in which drain current flows even when voltage is not applied to a gate electrode), a second gate electrode which faces the gate electrode with the oxide semiconductor film 644 interposed therebetween may be provided, whereby the threshold voltage can be controlled.

Note that although the oxide semiconductor film 644 may be amorphous, a crystalline oxide semiconductor film is preferably used for a channel formation region of the transistor. This is because the reliability (resistance to the gate bias stress) of the transistor can be improved by using the crystalline oxide semiconductor film.

Although the crystalline oxide semiconductor film is ideally in a single-crystal state, it is also preferable that the crystalline oxide semiconductor film include a crystal with c-axis alignment (also referred to as c-axis aligned crystal (CAAC)).

A sputtering method can be used to form an oxide semiconductor film including CAAC. In order to obtain the oxide semiconductor film including CAAC by a sputtering method, it is important to form hexagonal crystals in an initial stage of deposition of an oxide semiconductor film and to cause crystal growth from the hexagonal crystals as cores. In order to achieve this, it is preferable that the distance between the target and the substrate be made to be longer (e.g., approximately 150 mm to 200 mm) and a substrate heating temperature be 100° C. to 500° C., more preferably 200° C. to 400° C., or still more preferably 250° C. to 300° C. In addition to this, the deposited oxide semiconductor film is subjected to heat treatment at a temperature higher than the substrate heating temperature in the deposition, so that microdefects in the film and defects at the interface of a stacked layer can be repaired.

Figure 3B:
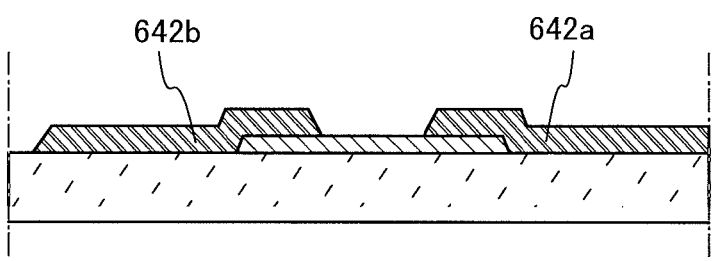

Next, a conductive layer for forming a source electrode and a drain electrode (including a wiring fainted using the same layer as the source electrode and the drain electrode) is formed over the oxide semiconductor film 644 and the like and is processed, so that the source or drain electrode 642a and the source or drain electrode 642b are formed (see FIG. 3B).

The conductive layer can be formed by a PVD method or a CVD method. As a material for the conductive layer, an element selected from aluminum, chromium, copper, tantalum, titanium, molybdenum, and tungsten; an alloy containing any of these elements as its component; or the like can be used. Further, one or more materials selected from manganese, magnesium, zirconium, beryllium, neodymium, and scandium may be used.

The conductive layer can have a single-layer structure or a stacked-layer structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, or the like. Note that in the case where the conductive layer has the single-layer structure of a titanium film or a titanium nitride film, there is an advantage that the source or drain electrode 642a and the source or drain electrode 642b can be easily processed to be tapered.

Alternatively, the conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer is preferably etched so that end portions of the source or drain electrode 642a and the source or drain electrode 642b are tapered. Here, a taper angle is, for example, preferably greater than or equal to 30° and less than or equal to 60°. When etching is performed so that the end portions of the source or drain electrode 642a and the source or drain electrode 642b are tapered, the coverage with a gate insulating layer 646 to be formed later can be improved and disconnection can be prevented.

The channel length (L) of the transistor is determined by a distance between lower end portions of the source and the drain electrodes. Note that in the case where the channel length (L) of the transistor is 25 nm or less, light exposure for forming a mask is preferably performed with extreme ultraviolet rays whose wavelength is as short as several nanometers to several tens of nanometers. In the light exposure by extreme ultraviolet light, the resolution is high and the focus depth is large. For these reasons, the channel length (L) of the transistor to be formed later can be in the range of greater than or equal to 10 nm and less than or equal to 1000 nm (1 µm), and the circuit can operate at higher speed. Further, power consumption of the storage device can be reduced by miniaturization.

Figure 3C:
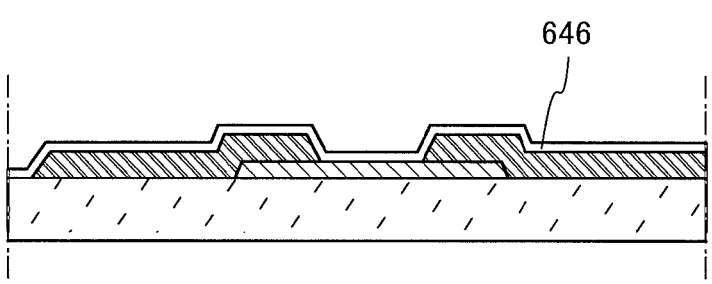

Next, the gate insulating layer 646 is formed so as to cover the source or drain electrode 642a and the source or drain electrode 642b and to be in contact with part of the oxide semiconductor film 644 (see FIG. 3C).

The gate insulating layer 646 can be formed by a CVD method, a sputtering method, or the like. The gate insulating layer 646 is preferably formed so as to contain silicon oxide, silicon nitride, silicon oxynitride, gallium oxide, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 646 may have a single-layer structure or a stacked-layer structure using any of the above materials. There is no particular limitation on the thickness; however, in the case where the storage device is miniaturized, the thickness of the gate insulating layer is preferably small for ensuring operation of the transistor. For example, in the case where silicon oxide is used as the gate insulating layer, the thickness can be set to greater than or equal to 1 nm and less than or equal to 100 nm, preferably greater than or equal to 10 nm and less than or equal to 50 nm.

When the gate insulating layer is thin as described above, gate leakage due to a tunnel effect or the like becomes a problem. In order to solve the problem of gate leakage, the gate insulating layer 646 may be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. The use of a high-k material for the gate insulating layer 646 makes it possible to increase the thickness in order to reduce gate leakage as well as ensuring electric characteristics. Note that a stacked-layer structure of a film containing a high-k material and a film containing any one of silicon oxide, silicon nitride, silicon oxynitride, silicon nitride oxide, aluminum oxide, and the like may be employed.

Further, an insulating layer which is in contact with the oxide semiconductor film 644 may be an insulating material containing a Group 13 element and oxygen. Many oxide semiconductors contain a Group 13 element, and an insulating material containing a Group 13 element works well with an oxide semiconductor. By using such an insulating material containing a Group 13 element for the insulating layer which is in contact with the oxide semiconductor film, the state of an interface with the oxide semiconductor film can be kept well.

Here, an insulating material including a Group 13 element refers to an insulating material including one or more Group 13 elements. As the insulating material containing a Group 13 element, for example, gallium oxide, aluminum oxide, aluminum gallium oxide, gallium aluminum oxide, and the like are given. Here, aluminum gallium oxide refers to a material in which the amount of aluminum (atomic %) is larger than that of gallium (atomic %), and gallium aluminum oxide refers to a material in which the amount of gallium (atomic %) is larger than or equal to that of aluminum (atomic %).

For example, in the case where the gate insulating layer is formed in contact with an oxide semiconductor film containing gallium, when a material containing gallium oxide is used for the gate insulating layer, favorable characteristics can be kept at the interface between the oxide semiconductor film and the gate insulating layer. Further, when the oxide semiconductor film and the insulating layer containing gallium oxide are provided in contact with each other, pileup of hydrogen at the interface between the oxide semiconductor film and the insulating layer can be reduced. Note that a similar advantageous effect can be obtained in the case where an element in the same group as a constituent element of the oxide semiconductor is used for the insulating layer. For example, it is effective to form an insulating layer with the use of a material including aluminum oxide. Note that aluminum oxide has a property of not easily transmitting water, and thus it is preferable to use the material including aluminum oxide in terms of preventing water from entering the oxide semiconductor film.

The insulating layer which is in contact with the oxide semiconductor film 644 preferably contains oxygen in a proportion higher than that in the stoichiometric proportion, by heat treatment in an oxygen atmosphere, by oxygen doping, or the like. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating layer which is in contact with the oxide semiconductor film 644 is formed of gallium oxide, the composition of gallium oxide can be set to be $Ga_2O_x$ (x=3+α, 0<α<1) by heat treatment in an oxygen atmosphere or by oxygen doping. In the case where the insulating layer which is in contact with the oxide semiconductor film 644 is formed of aluminum oxide, the composition of aluminum oxide can be set to be $Al_2O_x$ (x=3+α, 0<α<1) by heat treatment in an oxygen atmosphere or by oxygen doping. In the case where the insulating layer which is in contact with the oxide semiconductor film 644 is formed of gallium aluminum oxide (or aluminum gallium oxide), the composition of gallium aluminum oxide (or aluminum gallium oxide) can be set to be $Ga_xAl_{2-x}O_{3+α}$ (0<x<2, 0<α<1) by heat treatment in an oxygen atmosphere or by oxygen doping.

By oxygen doping or the like, an insulating layer including a region where the proportion of oxygen is higher than that in the stoichiometric proportion can be formed. When the insulating layer including such a region is in contact with the oxide semiconductor film, oxygen that exists excessively in the insulating layer is supplied to the oxide semiconductor film, and oxygen deficiency in the oxide semiconductor film or at the interface between the oxide semiconductor film and the insulating layer is reduced. Thus, the oxide semiconductor film can be formed to an i-type or a substantially i-type oxide semiconductor.

Note that instead of the gate insulating layer 646, the insulating layer including the region where the proportion of oxygen is higher than that in the stoichiometric proportion may be used for an insulating layer serving as a base film of the oxide semiconductor film 644 or may be used for both the gate insulating layer 646 and the base insulating layer.

After the gate insulating layer 646 is formed, second heat treatment is preferably performed in an inert gas atmosphere or an oxygen atmosphere. The temperature of the heat treatment is set in the range of higher than or equal to 200° C. and lower than or equal to 450° C., preferably higher than or equal to 250° C. and lower than or equal to 350° C. For example, the heat treatment may be performed at 250° C. in a nitrogen atmosphere for one hour. The second heat treatment can reduce variation in electric characteristics of the transistor. Further, in the case where the gate insulating layer 646 includes oxygen, oxygen is supplied to the oxide semiconductor film 644 to fill oxygen vacancy in the oxide semiconductor film 644, whereby an i-type oxide semiconductor film or a substantially i-type oxide semiconductor film can be formed.

Note that here, although the second heat treatment is performed after the gate insulating layer 646 is formed, the timing of the second heat treatment is not limited thereto. For example, the second heat treatment may be performed after a gate electrode is formed. Alternatively, the first heat treatment and the second heat treatment may be successively performed, the first heat treatment may also serve as the second heat treatment, or the second heat treatment may also serve as the first heat treatment.

As described above, at least one of the first heat treatment and the second heat treatment is employed, whereby the substance including a hydrogen atom can be excluded as much as possible and the oxide semiconductor film 644 can be highly-purified.

Figure 3D:
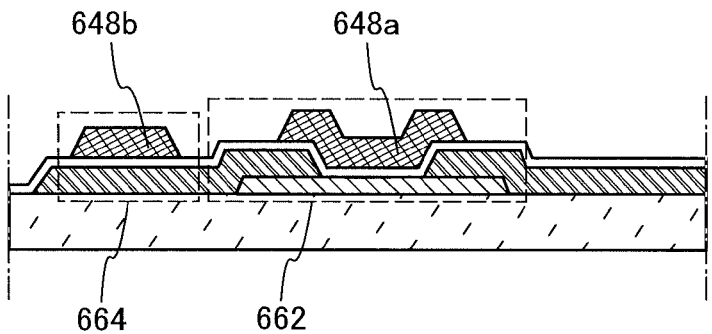

Next, a conductive layer for forming a gate electrode (including a wiring formed using the same layer as the gate electrode) is formed and is processed, so that a gate electrode 648a and a conductive film 648b are formed (see FIG. 3D).

The gate electrode 648a and the conductive film 648b can be formed using a metal material such as molybdenum, titanium, tantalum, tungsten, aluminum, copper, neodymium, or scandium; or an alloy material including any of these materials as its main component. Note that the gate electrode 648a and the conductive film 648b may have a single-layer structure or a stacked-layer structure.

Through the above steps, a transistor 662 including the highly-purified oxide semiconductor film 644 and a capacitor 664 are completed (see FIG. 3D).

In this manner, with the use of the oxide semiconductor film 644 which is highly-purified to be intrinsic, it becomes easier to sufficiently reduce the off-state current of the transistor. Further, with the use of such a transistor, a storage device capable of retaining stored data for an extremely long time can be obtained.

Embodiment 5

An oxide semiconductor including CAAC (c-axis aligned crystal), which has a non-crystalline portion and a crystalline portion is aligned in the c-axis direction, will be described.

The oxide semiconductor including CAAC is a novel oxide semiconductor.

The CAAC has a c-axis alignment and a triangular or hexagonal atomic arrangement when seen from the direction of the a-b plane, a top surface, or an interface.

In the oxide semiconductor including CAAC, metal atoms are arranged in a layered manner or metal atoms and oxygen atoms are arranged in a layered manner along the c-axis.

Further, in the CAAC, the direction of the a-axis or the b-axis is varied in the a-b plane (a rotation structure around the c-axis is provided).

In a broad sense, the CAAC is a non-single-crystal.

The CAAC has a triangular, hexagonal, regular triangular, or regular hexagonal atomic arrangement when seen from the direction perpendicular to the a-b plane.

In addition, in the oxide semiconductor including CAAC, an oxide has a phase where metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component.

Although the CAAC includes a crystallized portion (crystalline portion), a boundary between one crystalline portion and another crystalline portion is not clear in some cases.

Nitrogen may be substituted for part of oxygen included in the oxide semiconductor including CAAC.

The c-axes of individual crystalline portions included in the CAAC may be aligned in one direction (e.g., a direction perpendicular to a surface of a substrate over which the CAAC is formed or a surface of the CAAC).

Alternatively, the normals of the a-b planes of the individual crystalline portions included in the CAAC may be aligned in one direction (e.g., a direction perpendicular to a surface of a substrate over which the CAAC is formed or a surface of the CAAC).

The film including CAAC becomes a conductor, a semiconductor, or an insulator depending on its composition or the like. The CAAC transmits or does not transmit visible light depending on its composition or the like.

For example, when the oxide semiconductor film including CAAC is observed from a direction perpendicular to a surface of the film or a supporting substrate by an electron microscope, a triangular or hexagonal atomic arrangement is observed.

Further, when the cross section of the film is observed by an electron microscope, metal atoms are arranged in a layered manner or metal atoms and oxygen atoms (or nitrogen atoms) are arranged in a layered manner.

An example of a crystal structure of the CAAC will be described with reference to FIGS. 7A to 7E, FIGS. 8A to 8C, and FIGS. 9A to 9C.

In FIGS. 7A to 7E, FIGS. 8A to 8C, and FIGS. 9A to 9C, the vertical direction corresponds to the c-axis direction and a plane perpendicular to the c-axis direction corresponds to the a-b plane.

In this embodiment, the expressions of an "upper half" and a "lower half" refer to an upper half above the a-b plane and a lower half below the a-b plane, respectively.

Figure 7A:
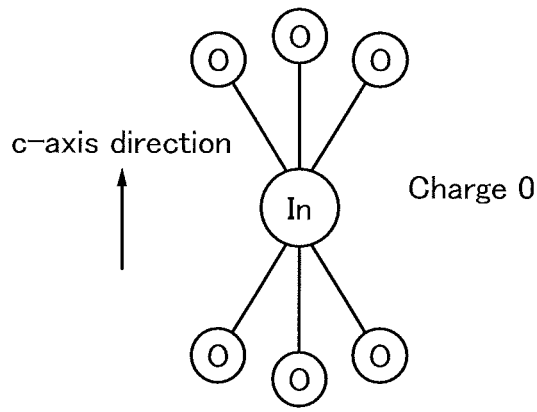
FIGS. 7A to 7E are examples of an oxide semiconductor.

FIG. 7A illustrates a structure A including one hexacoordinate In atom and six tetracoordinate oxygen (hereinafter referred to as tetracoordinate 0) atoms proximate to the In atom.

Here, a structure including one metal atom and oxygen atoms proximate thereto is referred to as a small group.

The structure A is actually an octahedral structure, but is illustrated as a planar structure for simplicity.

Note that in the structure A, three tetracoordinate O atoms exist in each of an upper half and a lower half. In the small group in the structure A, electric charge is 0.

Figure 7D:
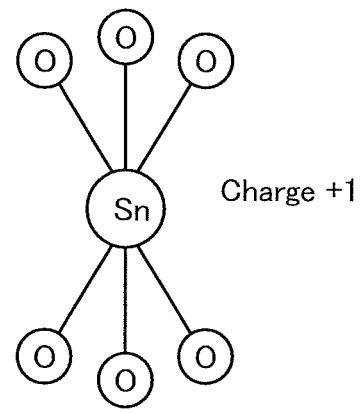
Figure 7B:
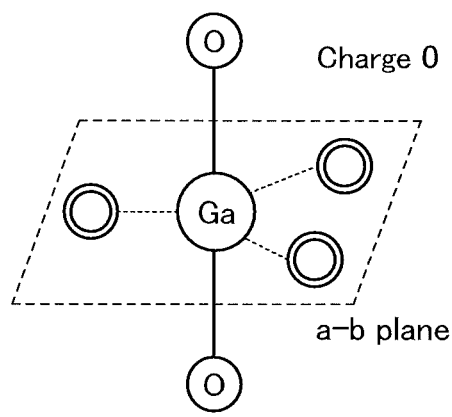

FIG. 7B illustrates a structure B including one pentacoordinate Ga atom, three tricoordinate oxygen (hereinafter referred to as tricoordinate O) atoms proximate to the Ga atom, and two tetracoordinate O atoms proximate to the Ga atom.

All the tricoordinate O atoms exist on the a-b plane. In the structure B, one tetracoordinate O atom exists in each of an upper half and a lower half.

An In atom can also have the structure B because an In atom can have five ligands. In the small group in the structure B, electric charge is 0.

Figure 7E:
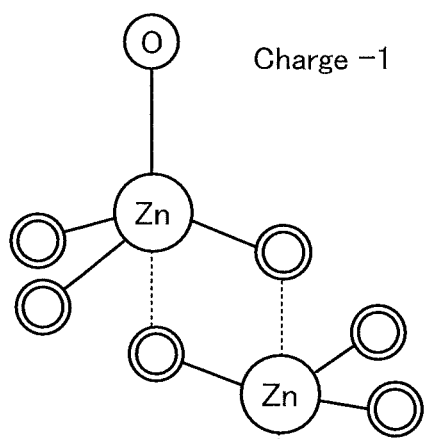
Figure 7C:
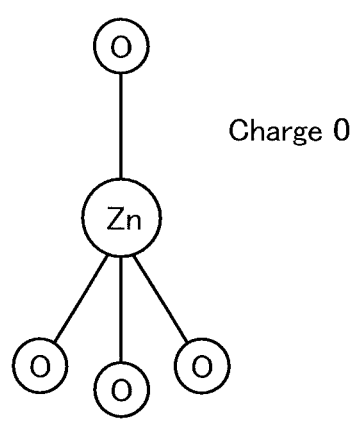

FIG. 7C illustrates a structure C including one tetracoordinate Zn atom and four tetracoordinate O atoms proximate to the Zn atom.

In the structure C, one tetracoordinate O atom exists in an upper half and three tetracoordinate O atoms exist in a lower half. In the small group in the structure C, electric charge is 0.

FIG. 7D illustrates a structure D including one hexacoordinate Sn atom and six tetracoordinate O atoms proximate to the Sn atom.

In the structure D, three tetracoordinate O atoms exist in each of an upper half and a lower half.

In the small group in the structure D, electric charge is +1.

FIG. 7E illustrates a structure E including two Zn atoms.

In the structure E, one tetracoordinate O atom exists in each of an upper half and a lower half In the small group in the structure E, electric charge is −1.

In this embodiment, a plurality of small groups form a medium group, and a plurality of medium groups form a large group (also referred to as a unit cell).

Now, a rule of bonding between the small groups will be described.

The three O atoms in the upper half with respect to the hexacoordinate In atom in FIG. 7A each have three proximate In atoms in the downward direction, and the three O atoms in the lower half each have three proximate In atoms in the upward direction.

The one O atom in the upper half with respect to the pentacoordinate Ga atom in FIG. 7B has one proximate Ga atom in the downward direction, and the one O atom in the lower half has one proximate Ga atom in the upward direction.

The one O atom in the upper half with respect to the tetracoordinate Zn atom in FIG. 7C has one proximate Zn atom in the downward direction, and the three O atoms in the lower half each have three proximate Zn atoms in the upward direction.

In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms.

Since the coordination number of the tetracoordinate O atom is 4, the sum of the number of the metal atoms proximate to and below the O atom and the number of the metal atoms proximate to and above the O atom is 4.

Accordingly, when the sum of the number of tetracoordinate O atoms above a metal atom and the number of tetracoordinate O atoms below another metal atom is 4, the two kinds of small groups including the metal atoms can be bonded.

For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction.

In addition to the above, a medium group can be formed in a different manner by combining a plurality of small groups so that the total electric charge of the layered structure is 0.

Figure 8A:
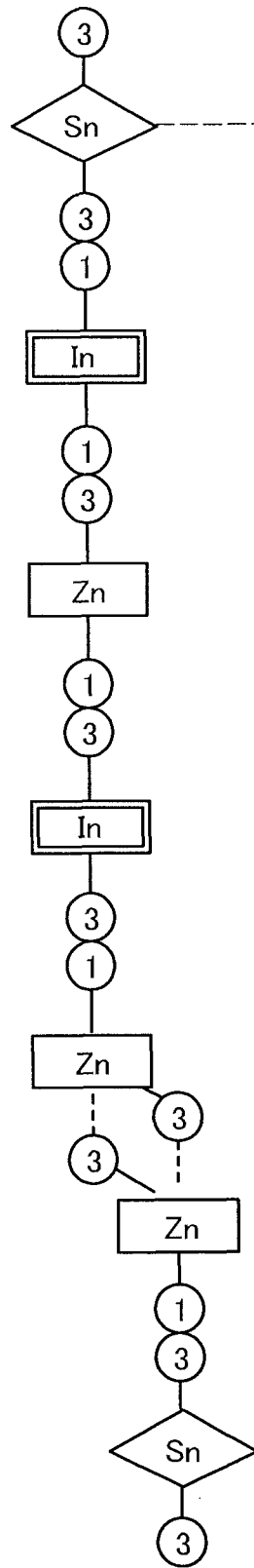
FIGS. 8A to 8C are examples of an oxide semiconductor.

FIG. 8A illustrates a model of a medium group A included in a layered structure of an In—Sn—Zn—O-based material.

Figure 8B:

FIG. 8B illustrates a large group B including three medium groups.

Figure 8C:
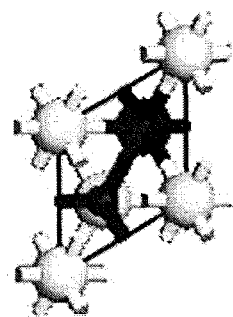

Note that FIG. 8C illustrates an atomic arrangement in the case where the layered structure in FIG. 8B is observed from the c-axis direction.

In the medium group A, a tricoordinate O atom is omitted, only the number of tetracoordinate O atoms is shown.

For example, three tetracoordinate O atoms existing in each of an upper half and a lower half with respect to a Sn atom are denoted by circled 3.

Similarly, in the medium group A, one tetracoordinate O atom existing in each of an upper half and a lower half with respect to an In atom is denoted by circled 1.

In addition, the medium group A illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group A included in the layered structure of the In—Sn—Zn—O-based material, in the order starting from the top, a Sn atom proximate to three tetracoordinate O atoms in each of an upper half and a lower half is bonded to an In atom proximate to one tetracoordinate O atom in each of an upper half and a lower half.

The In atom is bonded to a Zn atom proximate to three tetracoordinate O atoms in an upper half.

The Zn atom is bonded to an In atom proximate to three tetracoordinate O atoms in each of an upper half and a lower half through one tetracoordinate O atom in a lower half with respect to the Zn atom.

That In atom is bonded to a small group that includes two Zn atoms and that is proximate to one tetracoordinate O atom in an upper half.

The small group is bonded to a Sn atom proximate to three tetracoordinate O atoms in each of an upper half and a lower half through one tetracoordinate O atom in a lower half with respect to the small group.

A plurality of such medium groups are bonded, so that a large group is formed.

Here, electric charge for one bond of a tricoordinate O atom and electric charge for one bond of a tetracoordinate O atom can be assumed to be −0.667 and −0.5, respectively.

For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1.

Therefore, electric charge of −1, which cancels +1, is needed to form a layered structure including a Sn atom.

As a structure having electric charge of −1, the small group including two Zn atoms as shown in the structure E can be given.

For example, with one small group including two Zn atoms, electric charge of one small group including a Sn atom can be cancelled, so that the total electric charge of the layered structure can be 0.

When the large group B is repeated, an In—Sn—Zn—O-based crystal ($In_2SnZn_3O_8$) can be obtained.

A layered structure of the obtained In—Sn—Zn—O-based crystal can be expressed as a composition formula, $In_2SnZn_2O_7(ZnO)_m$ (in is 0 or a natural number).

The same applies to the case where an oxide semiconductor used is not In—Sn—Zn—O-based one.

Figure 9A:
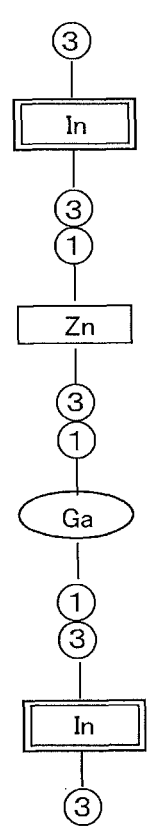
FIGS. 9A to 9C are examples of an oxide semiconductor.

For example, FIG. 9A illustrates a model of a medium group L included in a layered structure of an In—Sn—Zn—O-based material.

In the medium group L included in the layered structure of the In—Ga—Zn—O-based material, in the order starting from the top, an In atom proximate to three tetracoordinate O atoms in each of an upper half and a lower half is bonded to a Zn atom proximate to one tetracoordinate O atom in an upper half.

The Zn atom is bonded to a Ga atom proximate to one tetracoordinate O atom in each of an upper half and a lower half through three tetracoordinate O atoms in a lower half with respect to the Zn atom.

The Ga atom is bonded to an In atom proximate to three tetracoordinate O atoms in each of an upper half and a lower half through one tetracoordinate O atom in a lower half with respect to the Ga atom.

A plurality of such medium groups are bonded, so that a large group is formed.

Figure 9B:
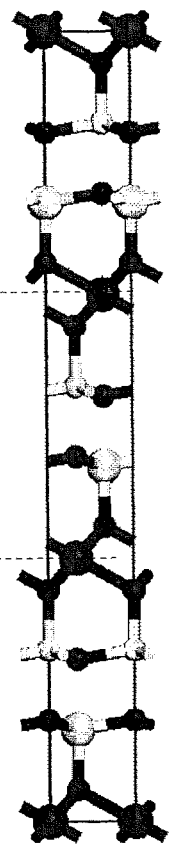

FIG. 9B illustrates a large group M including three medium groups.

Figure 9C:
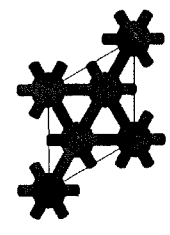

Note that FIG. 9C illustrates an atomic arrangement in the case where the layered structure in FIG. 9B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0.

As a result, the total electric charge of a medium group having a combination of such small groups is always 0.

In order to form the layered structure of the In—Ga—Zn—O-based material, a large group can be formed using not only the medium group L but also a medium group in which the arrangement of the In atom, the Ga atom, and the Zn atom is different from that of the medium group L.

Part of or all the contents of this embodiment can be implemented in combination with any of the other embodiments.

Embodiment 6

The actually measured field-effect mobility of an insulated gate transistor can be lower than its original mobility because of a variety of reasons; this phenomenon occurs not only in the case of using an oxide semiconductor.

One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility is expressed as a formula A in FIG. 10A.

E represents the height of the potential barrier, k represents the Boltzmann constant, and T represents the absolute temperature.

When the potential barrier is assumed to be attributed to a defect, the height of the potential barrier is expressed as a formula B in FIG. 10B according to the Levinson model.

Here, e represents the elementary charge, N represents the average defect density per unit area in a channel, ∈ represents the permittivity of the semiconductor, n represents the number of carriers per unit area in the channel, $C_{ox}$ represents the capacitance per unit area, $V_g$ represents the gate voltage, and t represents the thickness of the channel.

In the case where the thickness of the semiconductor layer is less than or equal to 30 nm, the thickness of the channel may be regarded as being the same as the thickness of the semiconductor layer.

The drain current $I_d$ in a linear region is expressed as a formula C in FIG. 10C.

Here, L represents the channel length and W represents the channel width, and L and W are each 10 μm.

In addition, $V_d$ represents the drain voltage.

When dividing both sides of the formula C by $V_g$ and then taking logarithms of both sides, a formula D in FIG. 10D can be obtained.

The right side of the formula D is a function of $V_g$.

From the Formula D, it is found that the defect density N can be obtained from the slope of a line in which ln ($I_d/V_g$) is the ordinate and $1/V_g$ is the abscissa.

That is, the defect density can be evaluated from the $I_d$-$V_g$ characteristics of the transistor.

The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 $cm^2/Vs$.

The measured mobility of an In—Sn—Zn oxide including defects is approximately 35 $cm^2/Vs$.

However, assuming that no defect exists inside the semiconductor and at the interface between the semiconductor and an insulating film, the mobility $\mu_0$ of the oxide semiconductor is expected to be 120 $cm^2/Vs$.

Note that even when no defect exists inside a semiconductor, scattering at an interface between a channel and a gate insulating layer affects the transport property of the transistor. In other words, the mobility at a position that is distance x away from the interface between the channel and the gate insulating layer is expressed by a formula E in FIG. 10E.

D represents the electric field in the gate direction, and B and G are constants. B and G can be obtained from actual measurement results, and according to the above measurement results, B is $4.75 \times 10^7$ cm/s and G is 10 nm (the depth to which the influence of interface scattering reaches).

When D is increased (i.e., when the gate voltage is increased), the second term of the right side of the formula E is increased and accordingly the mobility $\mu_1$ is decreased.

Figure 11:
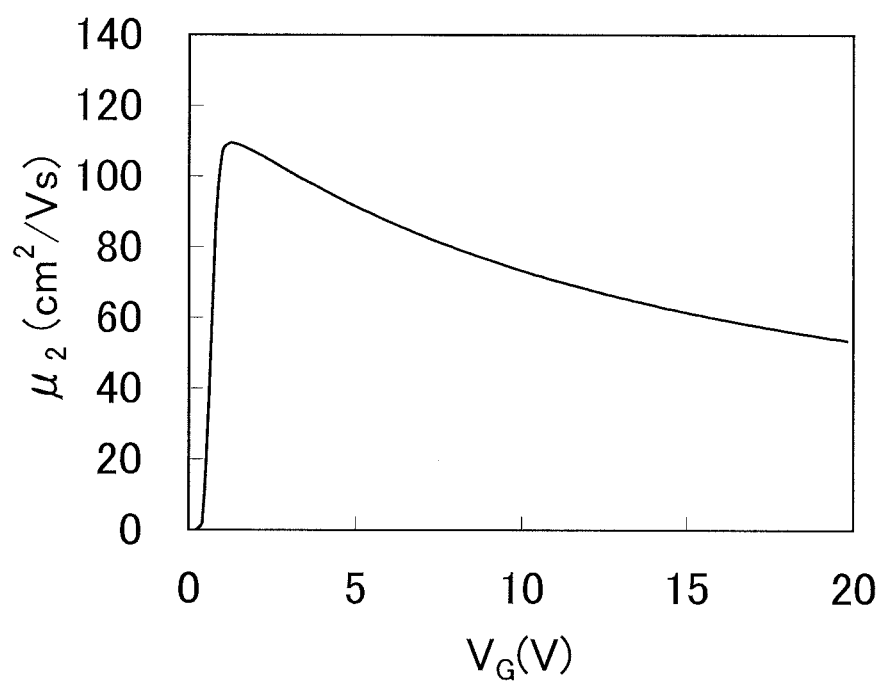
FIG. 11 shows a relation between gate voltage and field-effect mobility.

Calculation results of the mobility $\mu_2$ of a transistor whose channel includes an ideal oxide semiconductor without a defect inside the semiconductor are shown in FIG. 11.

Note that for the calculation, software, Sentaurus Device manufactured by Synopsys, Inc. was used.

For the calculation, the band gap, the electron affinity, the relative permittivity, and the thickness of the oxide semiconductor were assumed to be 2.8 eV, 4.7 eV, 15, and 15 nm, respectively.

These values were obtained by measuring a thin film that was formed by a sputtering method.

Further, the work functions of a gate, a source, and a drain were assumed to be 5.5 eV, 4.6 eV, and 4.6 eV, respectively.

The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown by the calculation results in FIG. 11, the mobility has a peak of more than 100 cm$^2$/Vs at a gate voltage that is a little over 1 V and is decreased as the gate voltage becomes higher because the influence of interface scattering is increased.

Note that in order to reduce interface scattering, it is preferable that a surface of the semiconductor layer be flat at the atomic level (atomic layer flatness).

Characteristics of minute transistors which are manufactured using an oxide semiconductor having such a mobility were calculated.

Note that in the oxide semiconductor film included in the transistor used for the calculation, a channel formation region is provided between a pair of n-type semiconductor regions.

The calculation was performed under the condition that the each resistivity of the pair of n-type semiconductor regions is $2 \times 10^{-3}$ Ωcm.

The calculation was performed under the condition that the channel length is 33 nm and the channel width is 40 nm.

A sidewall is formed on the side surface of the gate electrode.

The calculation was performed under the condition that part of the semiconductor region which overlaps with the sidewall is an offset region.

For the calculation, software, Sentaurus Device manufactured by Synopsys, Inc. was used.

Figure 12A:
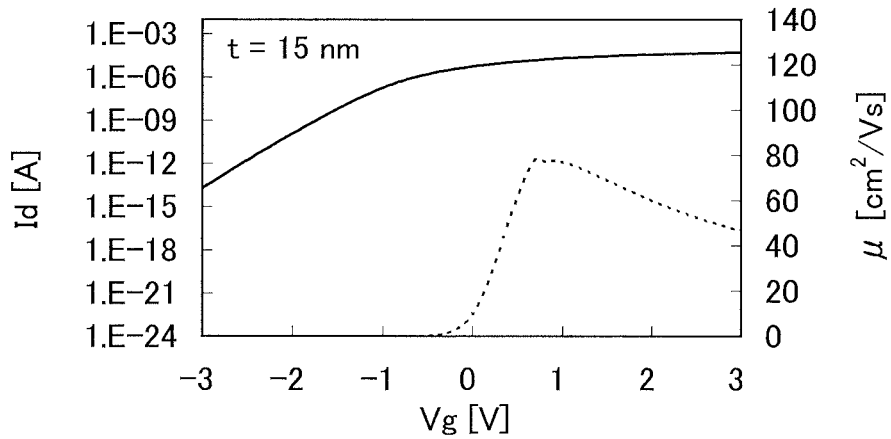
FIGS. 12A to 12C each show a relation between gate voltage and drain current.
Figure 12B:
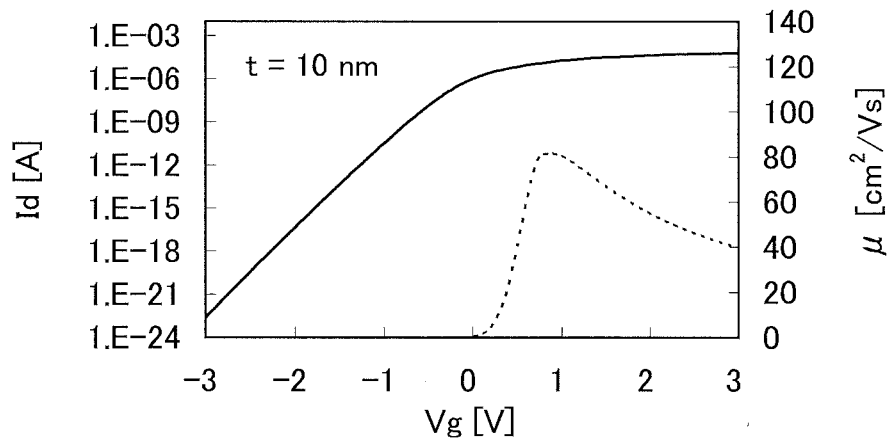
Figure 12C:
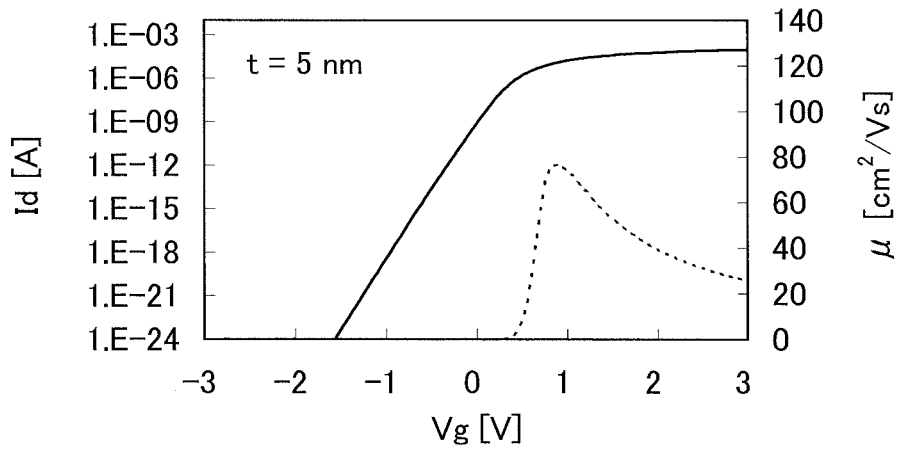

FIGS. 12A to 12C are calculation results of the gate voltage ($V_g$: a potential difference between the gate and the source) dependence of the drain current ($I_d$, solid line) and the mobility ($\mu$, dotted line) of the transistor.

The drain current $I_d$ is obtained by calculation under the condition that the drain voltage (a potential difference between the drain and the source) is +1 V and the mobility $\mu$ is obtained by calculation under the condition that the drain voltage is +0.1 V.

FIG. 12A shows the calculation result under the condition that the thickness of the gate insulating layer is 15 nm.

FIG. 12B shows the calculation result under the condition that the thickness of the gate insulating layer is 10 nm.

FIG. 12C shows the calculation result under the condition that the thickness of the gate insulating layer is 5 nm.

As the gate insulating layer is thinner, the drain current $I_d$ (off-state current) particularly in an off state is significantly decreased.

In contrast, there is no noticeable change in the peak value of the mobility $\mu$ and the drain current $I_d$ (on-state current) in an on state.

Figure 13A:
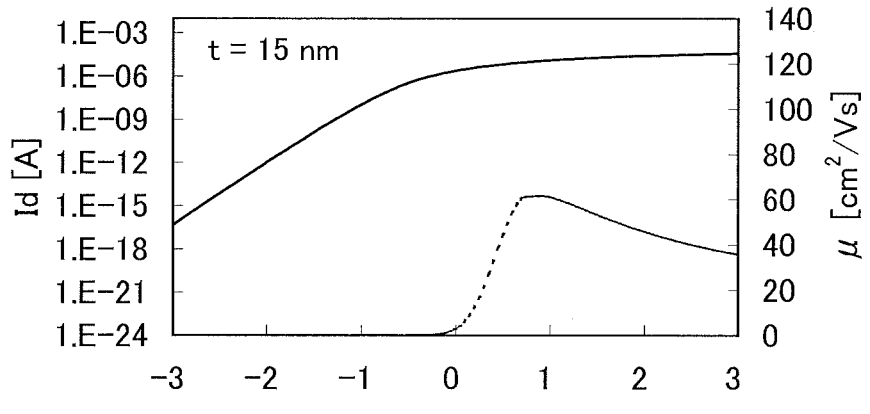
FIGS. 13A to 13C each show a relation between gate voltage and drain current.
Figure 13B:
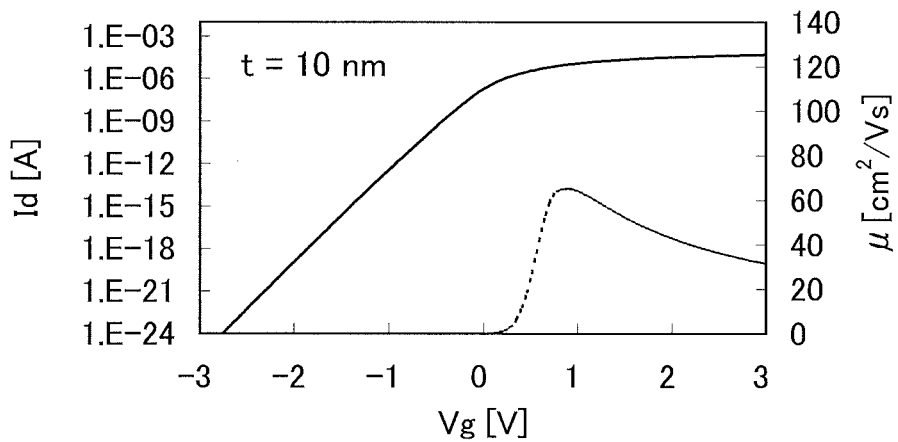
Figure 13C:
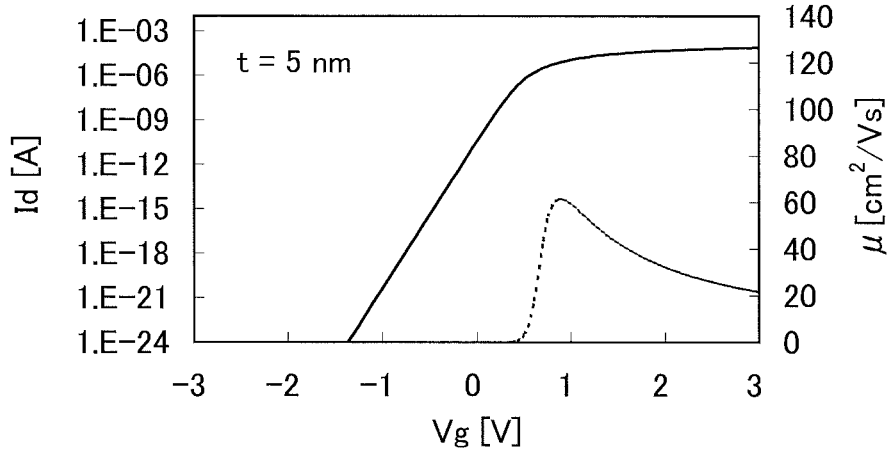

FIGS. 13A to 13C show the gate voltage $V_g$ dependence of the drain current $I_d$ (solid line) and the mobility $\mu$ (dot line) in the case where the offset length (sidewall length) $L_{off}$ is 5 nm.

The drain current $I_d$ is obtained by calculation under the condition that the drain voltage is +1 V and the mobility $\mu$ is obtained by calculation under the condition that the drain voltage is +0.1 V.

FIG. 13A shows the calculation result under the condition that the thickness of the gate insulating layer is 15 nm.

FIG. 13B shows the calculation result under the condition that the thickness of the gate insulating layer is 10 nm.

FIG. 13C shows the calculation result under the condition that the thickness of the gate insulating layer is 5 nm.

Figure 14A:
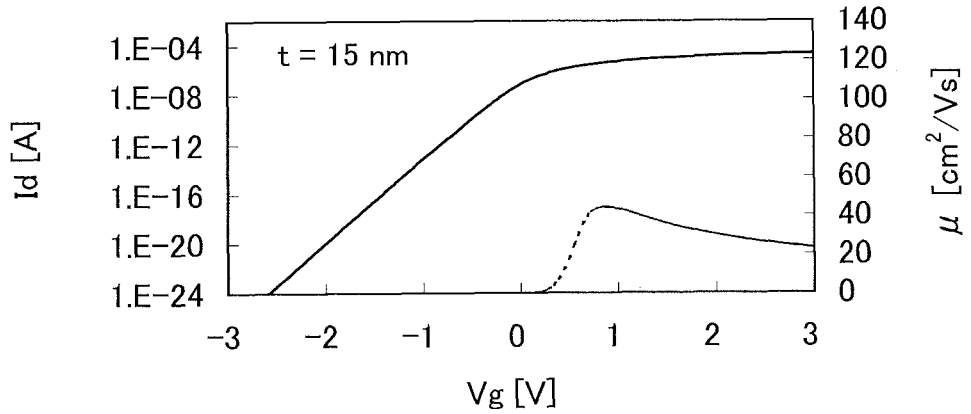
FIGS. 14A to 14C each show a relation between gate voltage and drain current.
Figure 14B:
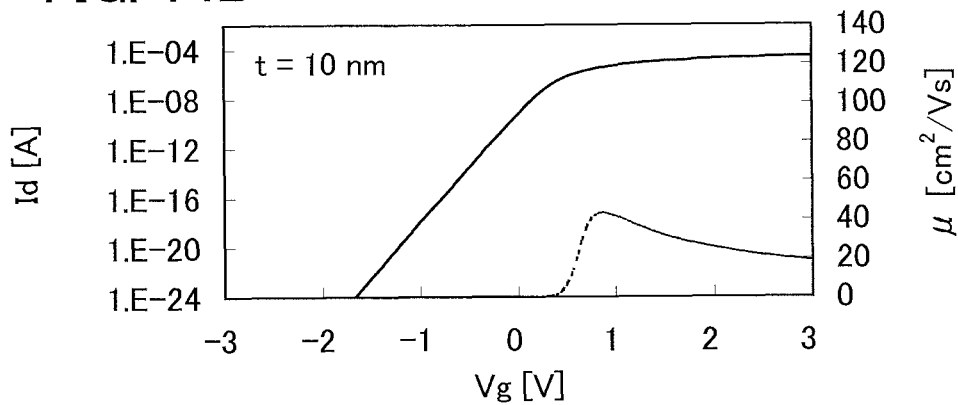
Figure 14C:
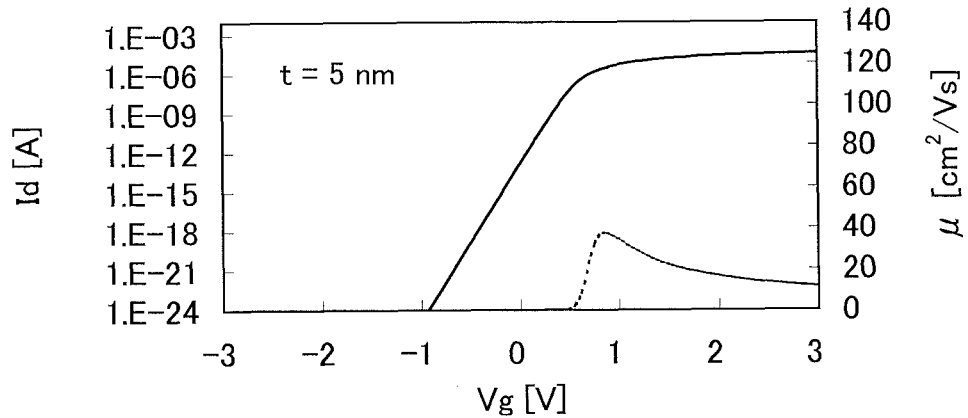

FIGS. 14A to 14C show the gate voltage $V_g$ dependence of the drain current $I_d$ (solid line) and the mobility $\mu$ (dot line) in the case where the offset length (sidewall length) $L_{off}$ is 15 nm.

The drain current $I_d$ is obtained by calculation under the condition that the drain voltage is +1 V and the mobility $\mu$ is obtained by calculation under the condition that the drain voltage is +0.1 V.

FIG. 14A shows the calculation result under the condition that the thickness of the gate insulating layer is 15 nm.

FIG. 14B shows the calculation result under the condition that the thickness of the gate insulating layer is 10 nm.

FIG. 14C shows the calculation result under the condition that the thickness of the gate insulating layer is 5 nm.

In either of the structures, as the gate insulating layer is thinner, the off-state current is significantly decreased, whereas no noticeable change arises in the peak value of the mobility $\mu$ and the on-state current.

Note that the peak of the mobility $\mu$ is approximately 80 cm$^2$/Vs in FIGS. 12A to 12C, approximately 60 cm$^2$/Vs in FIGS. 13A to 13C, and approximately 40 cm$^2$/Vs in FIGS. 14A to 14C; thus, the peak of the mobility $\mu$ is decreased as the offset length $L_{off}$ is increased.

Further, the same applies to the off-state current.

The on-state current is also decreased as the offset length $L_{off}$ is increased; however, the decrease in the on-state current is much more gradual than the decrease in the off-state current.

Further, the graphs show that in either of the structures, the drain current exceeds 10 μA, which is required in a memory element and the like, at a gate voltage of around 1 V.

Part of or all the contents of this embodiment can be implemented in combination with any of the other embodiments.

Embodiment 7

A transistor including an oxide semiconductor containing In, Sn, and Zn (ITZO) can have favorable characteristics by deposition of the oxide semiconductor while heating a substrate or by heat treatment after deposition of an oxide semiconductor film.

Note that each of In, Sn, and Zn is preferably included in a composition at 5 atomic % or more.

By intentionally heating the substrate after the deposition of the oxide semiconductor film including In, Sn, and Zn, the field-effect mobility of the transistor can be improved.

Further, the threshold voltage of an n-channel transistor can be shifted in the positive direction.

The threshold voltage of the n-channel transistor is shifted in the positive direction, whereby the absolute value of a voltage for maintaining the off state of the n-channel transistor can be reduced; thus, low power consumption can be achieved.

In addition, when the threshold voltage of the n-channel transistor is shifted in the positive direction to 0 V or more, a normally-off transistor can be obtained.

Characteristics of a transistor including ITZO will be described below.

(Common Conditions of Sample A to Sample C)

An oxide semiconductor film was formed over a substrate to have a thickness of 15 nm under the following conditions: a target having a composition ratio of In:Sn:Zn=1:1:1 is used; the gas flow rate is $Ar/O_2$=6/9 sccm; the deposition pressure is 0.4 Pa; and the deposition power is 100 W.

Next, the oxide semiconductor film was etched in an island shape.

Then, a tungsten layer was deposited over the oxide semiconductor film to have a thickness of 50 nm. The tungsten layer was etched, so that a source electrode and a drain electrode were formed.

After that, a silicon oxynitride (SiON) film was formed as a gate insulating layer to have a thickness of 100 nm by a plasma CVD method using a silane ($SiH_4$) gas and dinitrogen monoxide ($N_2O$) gas.

Then, a gate electrode was formed in the following manner: a tantalum nitride layer was formed to have a thickness of 15 nm; a tungsten layer was formed to have a thickness of 135 nm; and these were etched.

After that, a silicon oxynitride (SiON) film with a thickness of 300 nm and a polyimide film with a thickness of 1.5 μm were formed as an interlayer insulating film by a plasma CVD method.

Next, a pad for measurement was formed in the following manner a contact hole was formed in the interlayer insulating film; a first titanium film was formed to have a thickness of 50 nm; an aluminum film was formed to have a thickness of 100 nm; a second titanium film was formed to have a thickness of 50 nm; and these films were etched.

In this manner, a semiconductor device including a transistor was formed.

(Sample A)

In Sample A, heating was not intentionally performed to the substrate during the deposition of the oxide semiconductor film.

Further in Sample A, heat treatment was not performed in a period after the oxide semiconductor film was deposited before the oxide semiconductor film was etched.

(Sample B)

In Sample B, the oxide semiconductor film was deposited while the substrate was heated at 200° C.

Further in Sample B, heat treatment was not performed in a period after the oxide semiconductor film was deposited before the oxide semiconductor film was etched.

The oxide semiconductor film was deposited while the substrate was heated in order to remove hydrogen serving as a donor in the oxide semiconductor film.

(Sample C)

In Sample C, the oxide semiconductor film was deposited while the substrate was heated at 200° C.

Further in Sample C, heat treatment in a nitrogen atmosphere was performed at 650° C. for one hour and then heat treatment in an oxygen atmosphere was performed at 650° C. for one hour after the oxide semiconductor film was deposited before the oxide semiconductor film was etched.

The heart treatment was performed in a nitrogen atmosphere at 650° C. for one hour in order to remove hydrogen serving as a donor in the oxide semiconductor film.

With the heat treatment for removing hydrogen serving as a donor in the oxide semiconductor film, oxygen is also removed to form oxygen vacancy serving as a carrier in the oxide semiconductor film.

Thus, the heat treatment in an oxygen atmosphere at 650° C. for one hour was performed for reduction in oxygen vacancy.

(Characteristics of Transistors in Sample A to Sample C)

Figure 15A:
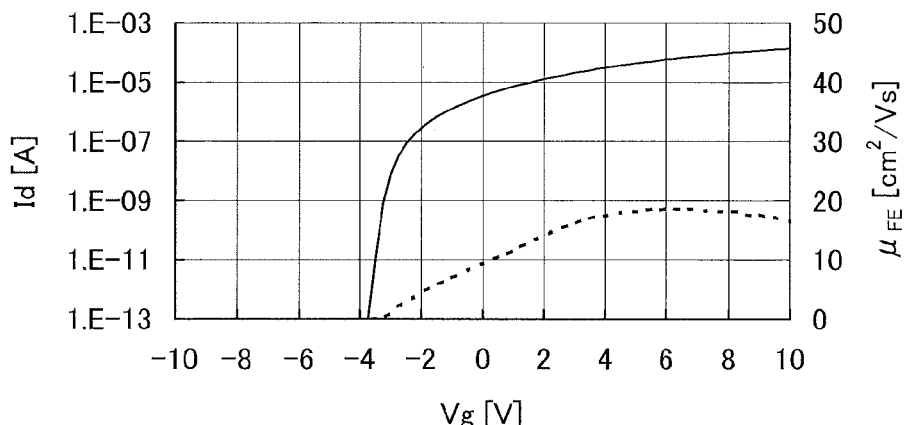
FIGS. 15A to 15C each show the characteristics of a transistor.

FIG. 15A shows initial characteristics of a transistor in Sample A.

Figure 15B:
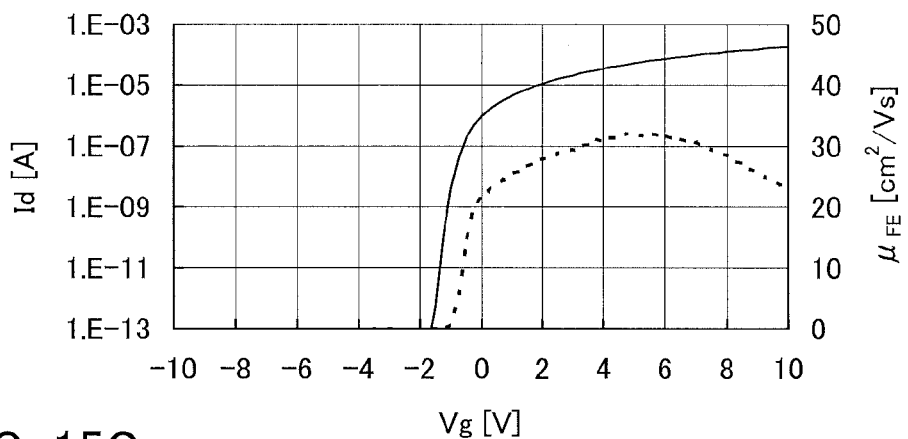

FIG. 15B shows initial characteristics of a transistor in Sample B.

Figure 15C:
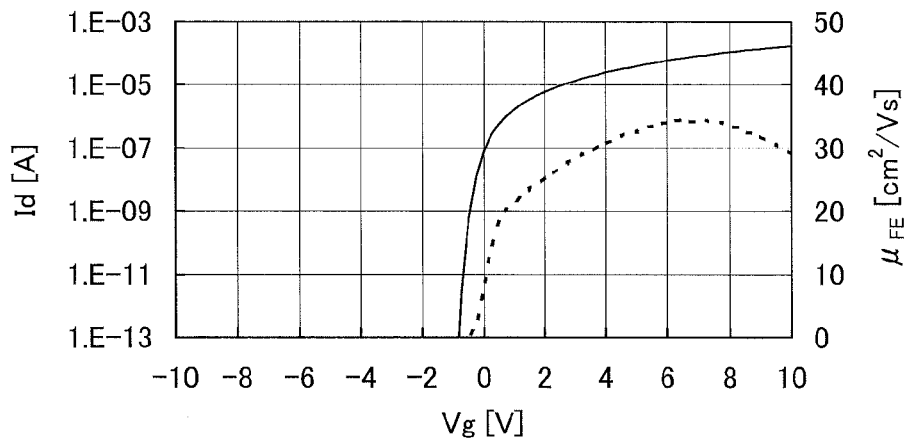

FIG. 15C shows initial characteristics of a transistor in Sample C.

The field-effect mobility of the transistor in Sample A was 18.8 $cm^2$/Vsec.

The field-effect mobility of the transistor in Sample B was 32.2 $cm^2$/Vsec.

The field-effect mobility of the transistor in Sample C was 34.5 $cm^2$/Vsec.

According to observations of cross sections of oxide semiconductor films, which were formed by deposition methods similar to respective those of Sample A to Sample C, with a transmission electron microscope (TEM), crystallinity was observed in samples formed by the deposition methods similar to respective those of Sample B and Sample C, substrates of which were heated during deposition.

Further, surprisingly, the sample, the substrate of which was heated during deposition, had a non-crystalline portion and a crystalline portion was aligned in the c-axis direction.

In a normal polycrystal, the crystalline portion is not aligned. Therefore, it can be said that the sample, the substrate of which was heated during deposition, has a novel crystal structure which has not been seen heretofore.

Comparison of FIG. 15A to FIG. 15C leads to understanding that heat treatment performed to the substrate during or after deposition can remove an hydrogen element serving as a donor, so that the threshold voltage of the n-channel transistor can be shifted in the positive direction.

That is, the threshold voltage of Sample B in which heating was performed to the substrate during deposition is shifted in the positive direction more than the threshold voltage of Sample A in which heating was not performed to the substrate during deposition.

In addition, comparing Sample B and Sample C, substrates of which were heated during deposition, it is found that the threshold voltage of Sample C in which heat treatment was performed after deposition is shifted in the positive direction more than the threshold voltage of Sample B in which heat treatment was not performed after deposition.

Furthermore, the higher the temperature of heat treatment is, the more the light element such as a hydrogen element tends to be removed; thus, hydrogen is more likely to be removed as the temperature of heat treatment is higher.

Accordingly, it can be considered that the threshold voltage can be shifted more in the positive direction by further increasing of the temperature of heat treatment.

(Results of the Gate BT Stress Test of Sample B and Sample C)

The gate BT stress test was performed on Sample B (without heat treatment after deposition) and Sample C (with heat treatment after deposition).

First, $V_g$-$I_d$ characteristics of the transistors were measured at a substrate temperature of 25° C. and $V_d$ of 10 V to measure characteristics of the transistors before heat treatment and high positive voltage application.

Then, the substrate temperature was set to 150° C. and $V_d$ was set to 0.1 V.

After that, 20 V of $V_g$ was applied and the condition was kept for one hour.

Next, $V_g$ was set to 0 V.

Then, $V_g$-$I_d$ characteristics of the transistors were measured at a substrate temperature of 25° C. and $V_d$ of 10 V to measure characteristics of the transistors after heat treatment and high positive voltage application.

Comparing characteristics of transistors before and after heat treatment and high positive voltage application in the above manner is called a positive BT test.

In a similar manner, $V_g$-$I_d$ characteristics of the transistors were measured at a substrate temperature of 25° C. and $V_d$ of 10 V to measure characteristics of the transistors before heat treatment and high negative voltage application.

Then, the substrate temperature was set to 150° C. and $V_d$ was set to 0.1 V.

After that, −20 V of $V_g$ was applied and the condition was kept for one hour.

Next, $V_g$ was set to 0 V.

Then, $V_g$-$I_d$ characteristics of the transistors were measured at a substrate temperature of 25° C. and $V_d$ of 10 V to measure characteristics of the transistors after heat treatment and high negative voltage application.

Comparing characteristics of transistors before and after heat treatment and high negative voltage application in the above manner is called a negative BT test.

Figure 16A:
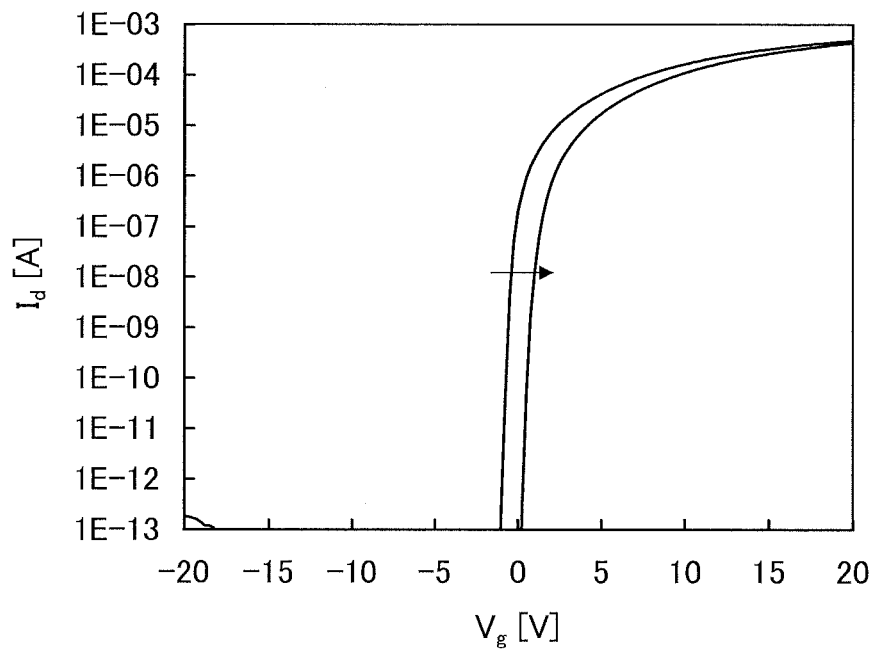
FIGS. 16A and 16B each show the characteristics of a transistor.
Figure 16B:
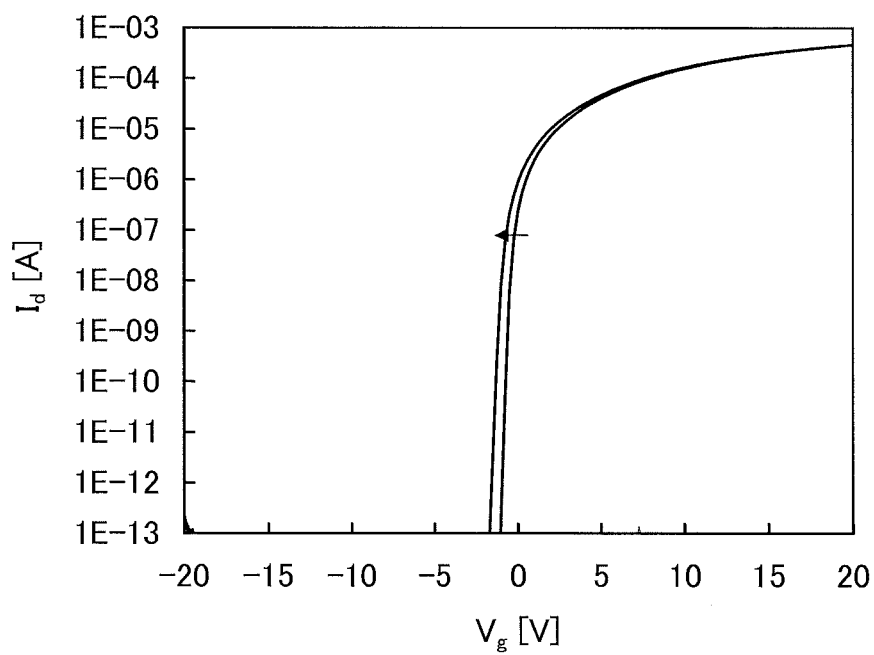

FIG. 16A shows a result of the positive BT test of Sample B and FIG. 16B shows a result of the negative BT test of Sample B.

Figure 17A:
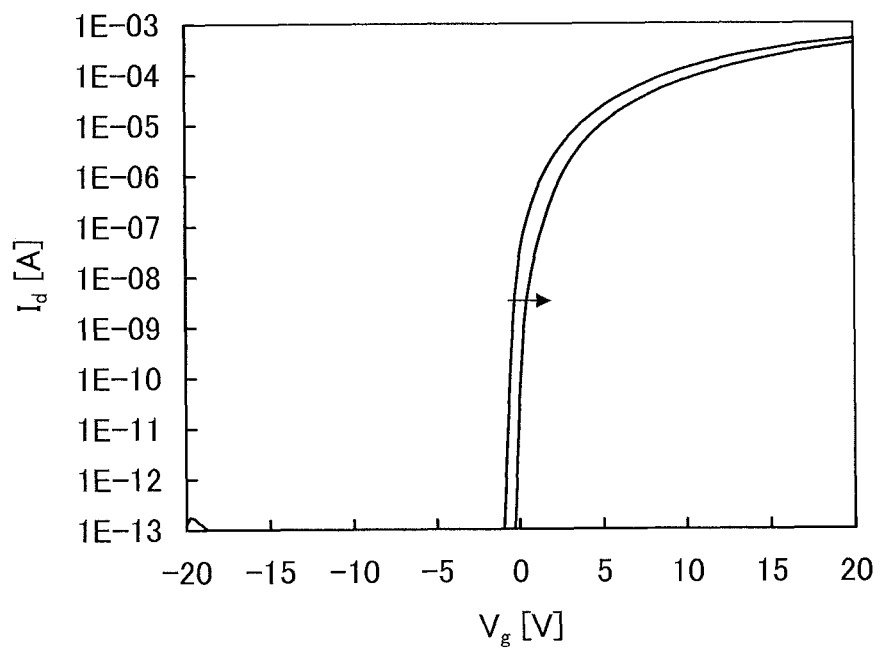
FIGS. 17A and 17B each show the characteristics of a transistor.
Figure 17B:
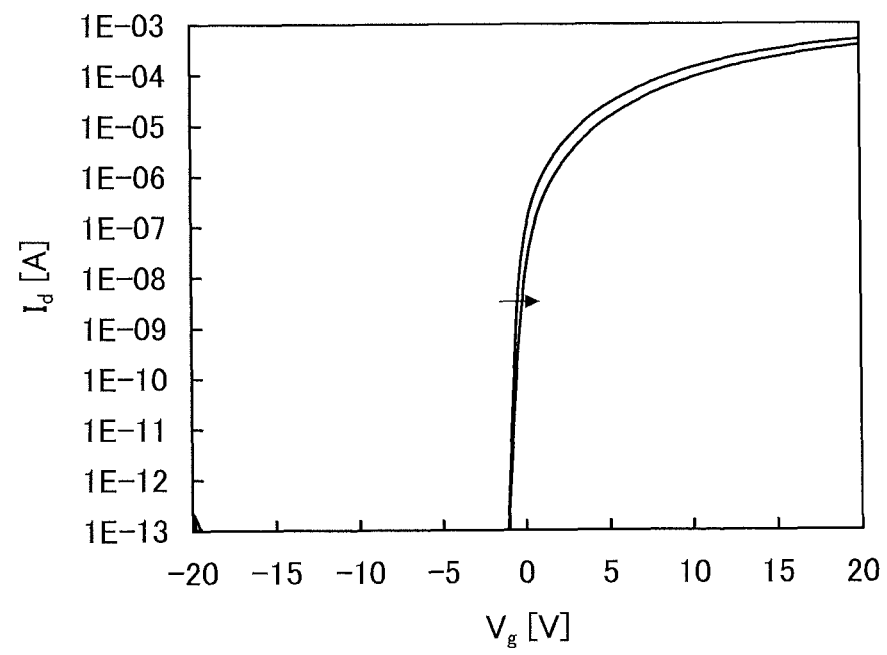

FIG. 17A shows a result of the positive BT test of Sample C and FIG. 17B shows a result of the negative BT test of Sample C.

Although the positive BT test and the negative BT test are tests used to determine the deterioration level of a transistor, with reference to FIG. 16A and FIG. 17A, it is found that the threshold voltage can be shifted in the positive direction by performing at least the positive BT test.

In FIG. 16A, in particular, it is found that a transistor becomes a normally-off transistor by being subjected to the positive BT test.

Therefore, it is revealed that the shift of the threshold voltage in the positive direction can be increased and a normally-off transistor can be formed by performing the positive BT test in addition to the heat treatment at the time of manufacturing the transistor.

Figure 18:
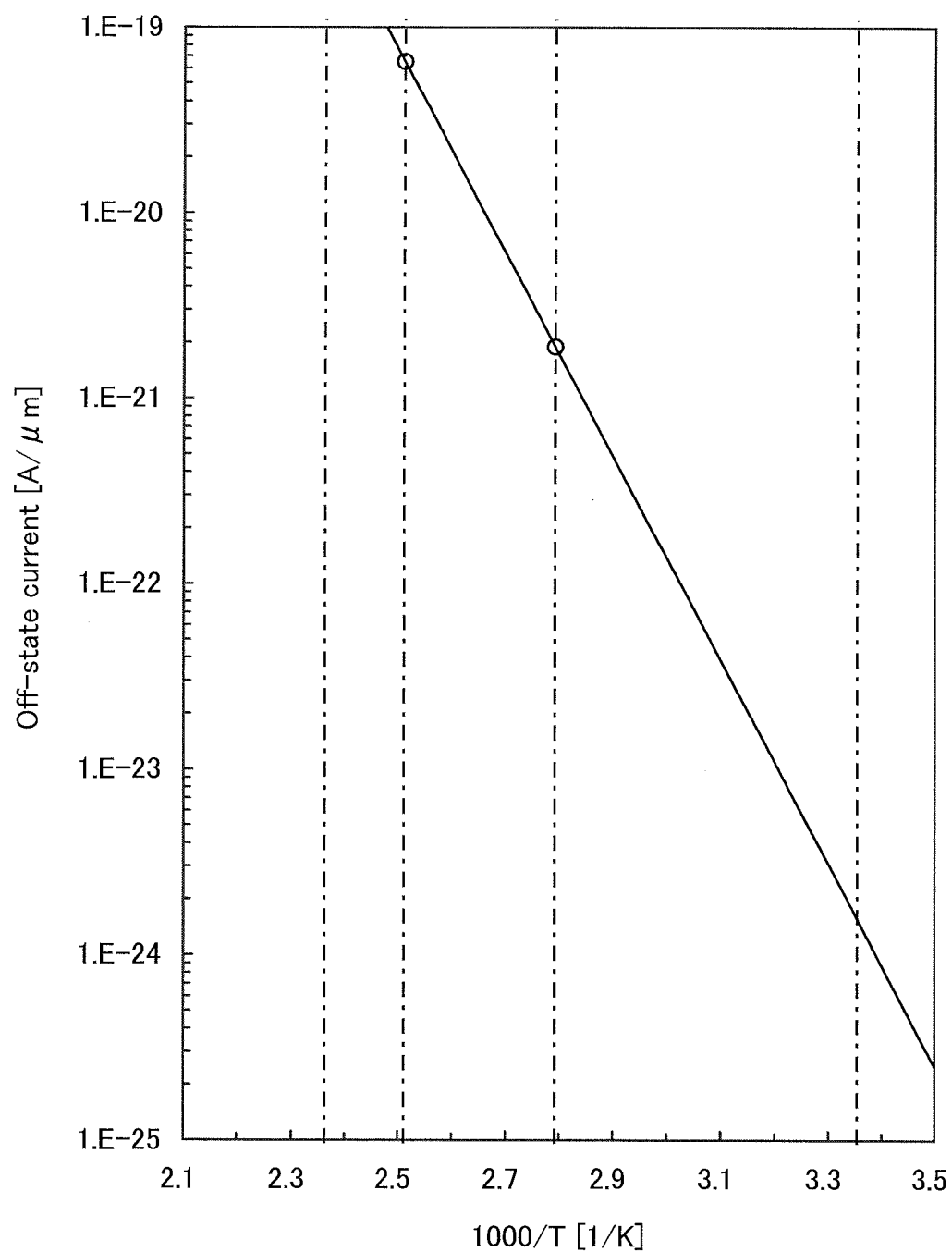
FIG. 18 shows the temperature dependence of off-state current of a transistor.

FIG. 18 shows a relation between the off-state current of a transistor in Sample A and the inverse of substrate temperature (absolute temperature) at measurement.

Here, the abscissa represents a value (1000/T) obtained by multiplying an inverse of substrate temperature at measurement by 1000.

Note that FIG. 18 illustrates the amount of current in the case where the channel width is 1 μm.

The off-state current was lower than or equal to $1 \times 10^{-19}$ A when the substrate temperature was 125° C. (1000/T is about 2.51).

Further, the off-state current was lower than or equal to $1 \times 10^{-20}$ A when the substrate temperature was 85° C. (1000/T is about 2.79).

That is, it is found that the off-state current is extremely low compared to a transistor including a silicon semiconductor.

Note that as the temperature is lower, the off-state current is decreased; thus, it is clear that the off-state current at room temperature is further lower.

Part of or all the contents of this embodiment can be implemented in combination with any of the other embodiments.

Embodiment 8

In this embodiment, application examples of a storage device using one embodiment of the present invention will be described with reference to FIGS. 4A to 4E. In this embodiment, the cases where the above-described storage device is applied to electronic devices such as a computer, a cellular phone (also referred to as a mobile phone or a mobile phone set), a personal digital assistant (including a portable game machine, an audio reproducing device, and the like), electronic paper, a television set (also referred to as a television or a television receiver), and the like will be described.

Figure 4A:
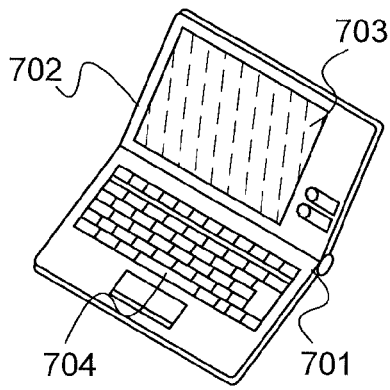
FIGS. 4A to 4E are views each illustrating an electronic device including a storage device.

FIG. 4A illustrates a notebook personal computer that includes a housing 701, a housing 702, a display portion 703, a keyboard 704, and the like. In at least one of the housings 701 and 702, the storage device described in any of the above embodiments is provided. Therefore, a notebook personal computer in which writing and reading of data are performed at high speed, data is stored for a long time, and power consumption is sufficiently reduced can be fabricated.

Figure 4D:
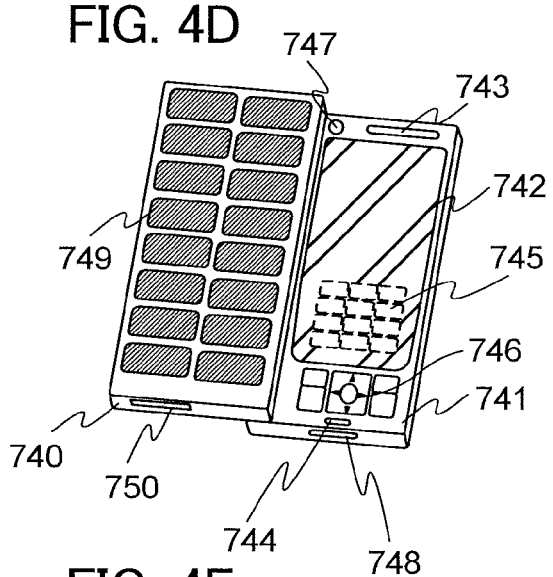
Figure 4B:
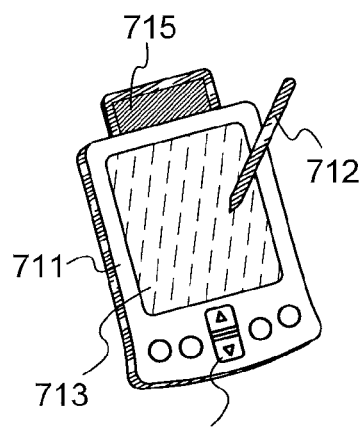

FIG. 4B illustrates a personal digital assistant (PDA). In a main body 711, a display portion 713, an external interface 715, an operation button 714, and the like are provided. Further, a stylus 712 and the like for operation of the personal digital assistant are provided. In the main body 711, the storage device described in any of the above embodiments is provided. Therefore, a personal digital assistant in which writing and reading of data are performed at high speed, data is stored for a long time, and power consumption is sufficiently reduced can be fabricated.

Figure 4E:
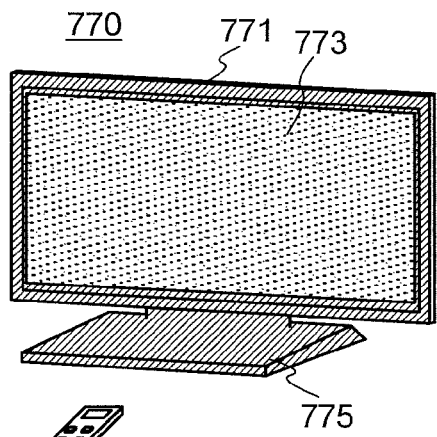
Figure 4C:
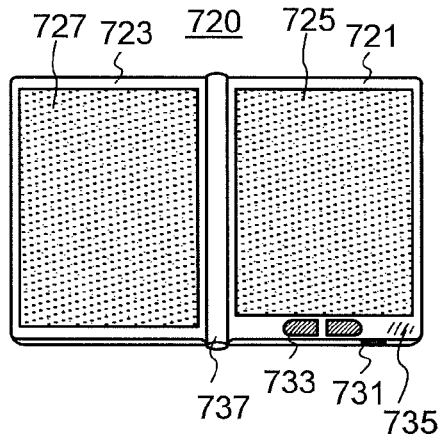

FIG. 4C illustrates an e-book reader 720 mounted with electronic paper, which includes two housings, a housing 721 and a housing 723. The housing 721 and the housing 723 are provided with a display portion 725 and a display portion 727, respectively. The housings 721 and 723 are connected by a hinge 737 and can be opened or closed with the hinge 737. The housing 721 is provided with a power source 731, an operation key 733, a speaker 735, and the like. At least one of the housings 721 and 723 is provided with the storage device described in any of the above embodiments. Therefore, an e-book reader in which writing and reading of data are performed at high speed, data is stored for a long time, and power consumption is sufficiently reduced can be fabricated.

FIG. 4D illustrates a cellular phone which includes two housings, a housing 740 and a housing 741. Moreover, the housings 740 and 741 which are shown unfolded in FIG. 4D can overlap with each other by sliding; thus, the size of the cellular phone can be reduced, which makes the cellular phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the cellular phone, an external memory slot 750, and the like. In addition, an antenna is incorporated in the housing 741. At least one of the housings 740 and 741 is provided with the storage device described in any of the above embodiments. Therefore, a cellular phone in which writing and reading of data are performed at high speed, data is stored for a long time, and power consumption is sufficiently reduced can be fabricated.

FIG. 4E illustrates a television set 770 which includes a housing 771, a display portion 773, a stand 775, and the like. The television set 770 can be operated with an operation switch included in the housing 771 or a remote controller 780.

The storage device described in any of the above embodiments is mounted on the housing 771 and the remote controller 780. Therefore, a television set in which writing and reading of data are performed at high speed, data is stored for a long time, and power consumption is sufficiently reduced can be fabricated.

As described above, the storage device in any of the above embodiments is mounted on each of the electronic devices described in this embodiment. Therefore, electronic devices in which power consumption is reduced can be fabricated.

EXPLANATION OF REFERENCE

001: transistor, 002: storage capacitor, 003: capacitor, 004: node, 005: amplifier circuit, 100: memory cell, 200: memory cell, 201: transistor, 204: node, 205: amplifier circuit, 210: differential amplifier circuit, 300: storage device, 400: reference circuit, 500: reference circuit, 510: differential amplifier circuit, 640: insulating film, 642a: source electrode or drain electrode, 642b: source electrode or drain electrode, 644: oxide semiconductor film, 646: gate insulating layer, 648a: gate electrode, 648b: conductive film, 662: transistor, 664: capacitor, 701: housing, 702: housing, 703: display portion, 704: keyboard, 711: main body, 712: stylus, 713: display portion, 714: operation button, 715: external interface, 720: e-book reader, 721: housing, 723: housing, 725: display portion, 727: display portion, 731: power source, 733: operation key, 735: speaker, 737: hinge, 740: housing, 741: housing, 742: display panel, 743: speaker, 744: microphone, 745: operation key, 746: pointing device, 747: camera lens, 748: external connection terminal, 749: solar cell, 750: external memory slot, 770: television set, 771: housing, 773: display portion, 775: stand, and 780: remote controller.

This application is based on Japanese Patent Application serial no. 2010-243833 filed with Japan Patent Office on Oct. 29, 2010 and Japanese Patent Application serial no. 2011-112645 filed with the Japan Patent Office on May 19, 2011, the entire contents of which are hereby incorporated by reference.

The invention claimed is:

1. A storage device comprising:
a word line and a bit line;
a memory cell comprising a transistor and a storage capacitor;
a capacitor; and
an amplifier circuit,
wherein the transistor includes an oxide semiconductor,
wherein a gate electrode of the transistor is electrically connected to the word line,
wherein one of source and drain electrodes of the transistor is electrically connected to the bit line,
wherein a first terminal of the storage capacitor is electrically connected to the other of the source and drain electrodes of the transistor,
wherein a second terminal of the storage capacitor is electrically connected to a first terminal of the capacitor to form a node,
wherein an input terminal of the amplifier circuit is directly connected to the second terminal of the storage capacitor, and
wherein a second terminal of the capacitor is electrically connected to a ground terminal.

2. The storage device according to claim 1, wherein the amplifier circuit comprises a source follower circuit.

3. The storage device according to claim 1, wherein the oxide semiconductor includes a crystal with c-axis alignment.

4. The storage device according to claim 1, wherein the node is in a floating state.

5. A storage device comprising:
a word line and a plurality of bit lines;
memory cells;
a capacitor; and
an amplifier circuit,
wherein each of the memory cells comprises a transistor and a storage capacitor,
wherein the transistor includes an oxide semiconductor,
wherein a gate electrode of the transistor is electrically connected to the word line,
wherein one of source and drain electrodes of the transistor is electrically connected to one of the plurality of bit lines,
wherein a first terminal of the storage capacitor is electrically connected to the other of the source and drain electrodes of the transistor,
wherein a second terminal of the storage capacitor is electrically connected to a first terminal of the capacitor to form a node,
wherein an input terminal of the amplifier circuit is directly connected to the second terminal of the storage capacitor, and
wherein a second terminal of the capacitor is electrically connected to a ground terminal.

6. The storage device according to claim 5, wherein the amplifier circuit comprises a source follower circuit.

7. The storage device according to claim 5, wherein the oxide semiconductor includes a crystal with c-axis alignment.

8. The storage device according to claim 5, wherein each capacitance value of the storage capacitor in the memory cells is different from each other.

9. The storage device according to claim 5,
wherein the storage device is electrically connected to a reference circuit, and
wherein the reference circuit comprises a same circuit configuration as a circuit configuration of the memory cells.

10. The storage device according to claim 5,
wherein the storage device comprises a plurality of blocks, and
wherein each of the plurality of blocks comprises the memory cells.

11. The storage device according to claim 5, wherein the node is in a floating state.

12. A storage device comprising:
a word line, a first bit line and a second bit line;
a first memory cell comprising a first transistor and a first storage capacitor;
a second memory cell comprising a second transistor and a second storage capacitor;
a capacitor; and
an amplifier circuit,
wherein the first transistor includes a first oxide semiconductor and the second transistor includes a second oxide semiconductor,
wherein a first gate electrode of the first transistor and a second gate electrode of the second transistor are electrically connected to the word line,
wherein one of source and drain electrodes of the first transistor is electrically connected to the first bit line,
wherein one of source and drain electrodes of the second transistor is electrically connected to the second bit line,
wherein a first terminal of the first storage capacitor is electrically connected to the other of the source and drain electrodes of the first transistor, wherein a first terminal of the second storage capacitor is electrically connected to the other of the source and drain electrodes of the second transistor, wherein a second terminal of the first storage capacitor and a second terminal of the second storage capacitor are electrically connected to a first terminal of the capacitor to form a node, wherein an input terminal of the amplifier circuit is directly connected to the second terminal of the first storage capacitor and the second terminal of the second storage capacitor, and wherein a second terminal of the capacitor is electrically connected to a ground terminal.

13. The storage device according to claim 12, wherein the amplifier circuit comprises a source follower circuit.

14. The storage device according to claim 12, wherein the first oxide semiconductor and the second oxide semiconductor include a crystal with c-axis alignment.

15. The storage device according to claim 12, wherein capacitance values of the first storage capacitor and the second storage capacitor are different from each other.

16. The storage device according to claim 12,
wherein the storage device is electrically connected to a reference circuit, and
wherein the reference circuit comprises a same circuit configuration as a circuit configuration of the first memory cell and the second memory cell.

17. The storage device according to claim 12,
wherein the storage device comprises a plurality of blocks, and
wherein each of the plurality of blocks comprises the first memory cell and the second memory cell.

18. The storage device according to claim 12, wherein the node is in a floating state.

* * * * *